(12) United States Patent
Takasawa et al.

(10) Patent No.: US 8,119,462 B2
(45) Date of Patent: *Feb. 21, 2012

(54) METHOD FOR FORMING CONDUCTIVE FILM, THIN-FILM TRANSISTOR, PANEL WITH THIN-FILM TRANSISTOR, AND METHOD FOR MANUFACTURING THIN-FILM TRANSISTOR

(75) Inventors: Satoru Takasawa, Sammu (JP); Masaki Takei, Sammu (JP); Hirohisa Takahashi, Sammu (JP); Hiroaki Katagiri, Sammu (JP); Sadayuki Ukishima, Sammu (JP); Noriaki Tani, Sammu (JP); Satoru Ishibashi, Sammu (JP); Tadashi Masuda, Tomisato (JP)

(73) Assignee: Ulvac, Inc., Chigasaki-Shi (JP)

( * ) Notice: Subject to any disclaimer, the term of this patent is extended or adjusted under 35 U.S.C. 154(b) by 157 days.

This patent is subject to a terminal disclaimer.

(21) Appl. No.: 12/364,836

(22) Filed: Feb. 3, 2009

(65) Prior Publication Data

US 2009/0173945 A1    Jul. 9, 2009

Related U.S. Application Data

(63) Continuation of application No. PCT/JP2007/065493, filed on Aug. 8, 2007.

(30) Foreign Application Priority Data

Aug. 10, 2006 (JP) ................. 2006-218122

(51) Int. Cl.
*H01L 21/00* (2006.01)

(52) U.S. Cl. .......... 438/149; 438/151; 438/157; 257/66; 257/741

(58) Field of Classification Search .................. 438/149, 438/151, 157, 166, 650, 686; 257/66, 741
See application file for complete search history.

(56) References Cited

U.S. PATENT DOCUMENTS 5,889,328 A *   3/1999   Joshi et al. ................... 257/751
(Continued)

FOREIGN PATENT DOCUMENTS

JP            10-12151          1/1998
(Continued)

OTHER PUBLICATIONS

Stanley Wolf Silicon processing for the VLSI era vol. 1, second edition Jul. 2000 pp. 464-468 Lattice Press.*

(Continued)

*Primary Examiner* — Thinh T Nguyen
(74) *Attorney, Agent, or Firm* — Kratz, Quintos & Hanson, LLP

(57) ABSTRACT

A conductive film having high adhesion and low specific resistance is formed. A target containing copper as a main component is sputtered in vacuum ambience while an oxygen gas introduced, and then, a conductive film containing copper as a main component and additive metals, such as Ti or Zr, is formed. Such a conductive film has high adhesion to a silicon layer and a glass substrate and is hardly peeled off from the substrate. Furthermore, the specific resistance is low and the contact resistance to a transparent conductive film is also low. Thus, no deterioration in the electric characteristics occurs even when the conductive film is used for an electrode film. Accordingly, the conductive film formed by the present invention suited for TFT, and electrode films and barrier films of semiconductor elements, in particular.

10 Claims, 10 Drawing Sheets

U.S. PATENT DOCUMENTS

| | | | |
|---|---|---|---|
| 6,080,646 A * | 6/2000 | Wang | 438/585 |
| 6,891,588 B2 * | 5/2005 | Kawachi et al. | 349/114 |
| 7,626,665 B2 * | 12/2009 | Koike | 349/139 |
| 2006/0088436 A1 | 4/2006 | Okabe | |
| 2011/0068338 A1 * | 3/2011 | Takasawa et al. | 257/57 |
| 2011/0068402 A1 * | 3/2011 | Takasawa et al. | 257/347 |

FOREIGN PATENT DOCUMENTS

| | | |
|---|---|---|
| JP | 2002-299284 A1 | 10/2002 |
| JP | 2005-158887 A1 | 6/2005 |
| JP | 2006-73863 A1 | 3/2006 |
| JP | 2006-193783 A1 | 7/2006 |
| WO | WO 2004/083482 A1 | 9/2004 |

OTHER PUBLICATIONS

International Search Report for International Application No. PCT/JP2007/065493 dated Oct. 4, 2007.

* cited by examiner

Fig. 1
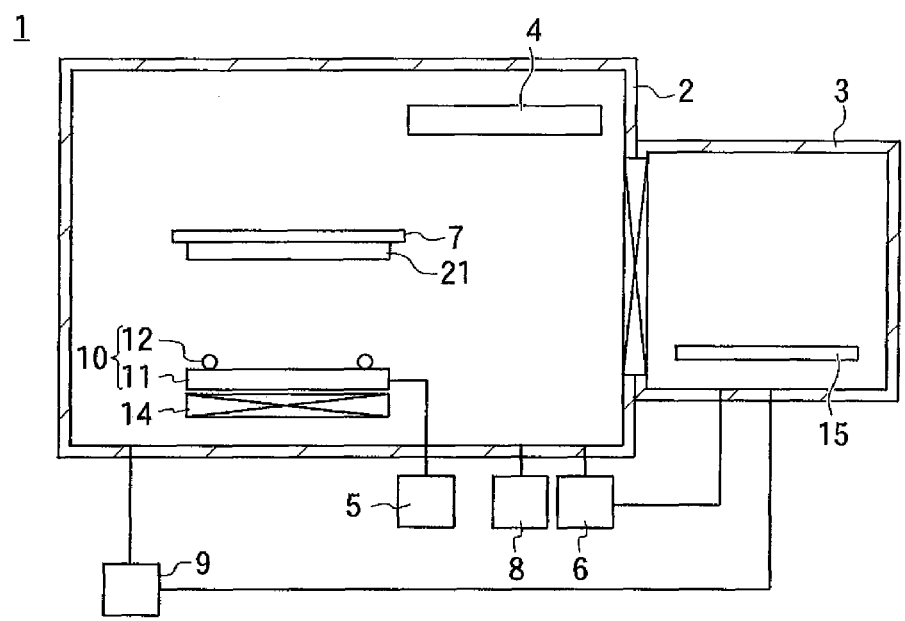
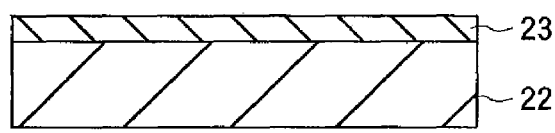
Fig. 2(a)
Fig. 2(b)
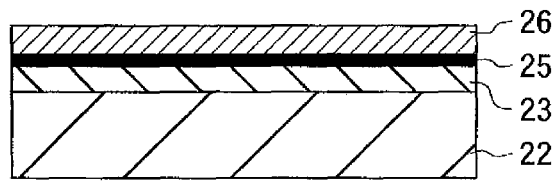
Fig. 2(c)

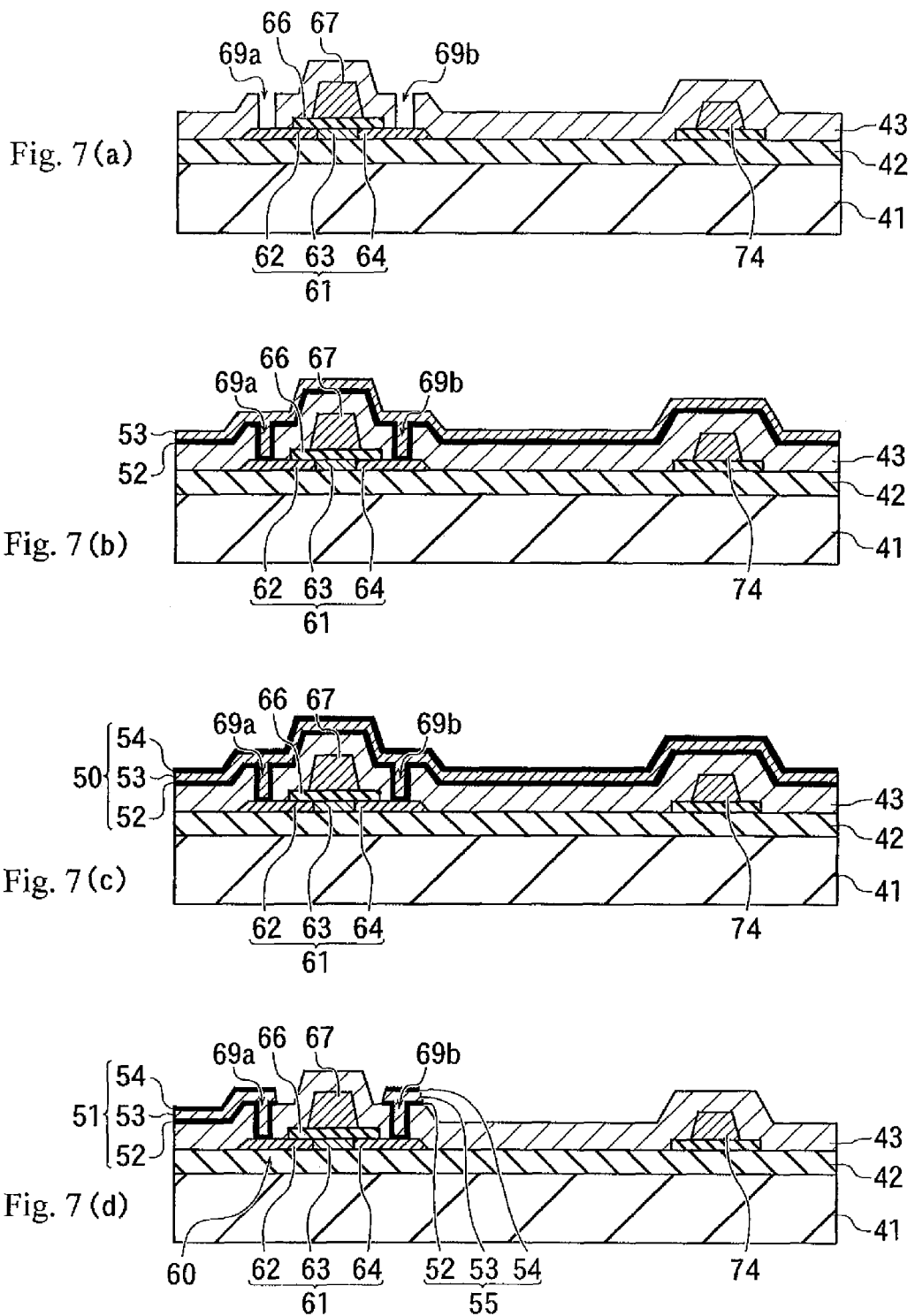

METHOD FOR FORMING CONDUCTIVE FILM, THIN-FILM TRANSISTOR, PANEL WITH THIN-FILM TRANSISTOR, AND METHOD FOR MANUFACTURING THIN-FILM TRANSISTOR

The present invention is a Continuation of International Application No. PCT/JP2007/065493 filed Aug. 8, 2007, which claims priority to Japan Patent Document No. 2006-218122, filed on Aug. 10, 2006. The entire disclosures of the prior applications are hereby incorporated by reference herein in their entireties.

BACKGROUND

The present invention generally relates to metallic wiring films for an electronic component and sputtering processes as film forming methods thereof.

Conventionally, low resistive materials (such as, Al and Cu, or, Mo, Cr, etc.) are used for metallic wiring films of an electronic component. For example, in a TFT (Thin film transistor) liquid crystal displays, a demand to reduce resistance of a wiring electrode increases with the upsizing of panels. Thus, the need to use Al or Cu as low resistive wiring increases.

In the use of Al wiring for TFT, problems occur; such problems include hillock generation in a post-process, diffusion to a foundation Si layer when Al wiring is used as source/drain electrodes, and degradation of contact resistance with a transparent electrode consisting of ITO (indium-tin-oxide). In order to avoid these problems, barrier layers for layering Mo, Cr, and an alloy film that contains these metals as a main component are necessary in the front and rear of the Al wiring.

In contrast, for Cu wiring, Cu has a lower resistive material than Al. For Al wiring, the degradation of contact resistance with an ITO transparent electrode becomes a problem. However, the contact resistance in Cu wiring remains in good condition, because Cu is less likely to be oxidized.

Accordingly, the need to use Cu as the low resistive wiring film increases. However, Cu has a problem of poor adhesiveness to a foundation material (such as, glass or Si) in comparison to other wiring materials and a problem of a diffusion of Cu to a Si layer when Cu is used as source/drain electrodes. Thus, a barrier layer in the interface between the Cu wiring and other layers are necessary to improve the adhesion and to prevent the diffusiveness.

Even for a foundation Cu seed layer for Cu plating used for semiconductors, barrier layers are necessary to prevent the diffusion of TiN, TaN or the like from a diffusion problem in the same manner as mentioned above.

As related patents of metallic wiring films for electronic components including Cu as a main component, the technology in which an element, such as Mo, is added to Cu (JPA No. 2005-158887) and the technology in which nitrogen and oxygen are introduced during a film forming process by sputtering of pure Cu (JPA No. 10-12151) are known. However, both of these technologies have problems of adhesiveness, resistance-reducing, and hillock resistance.

The present invention is intended to solve the above-described problems in the above-discussed prior technologies and provide a method for manufacturing Cu-based wiring films and Cu-based barrier layer films that satisfy low resistance, good contact resistance with an ITO transparent electrode, adhesiveness with a glass and Si, prevention of diffusion to a Si layer when used as source/drain electrodes, and hillock resistance, and excellent film characteristics that are required for these devices.

SUMMARY OF THE INVENTION

In order to solve the problems described above, the present invention is a method for forming a conductive film which forms a conductive film containing copper as a main component and additive metal on a surface of an object to be film formed in vacuum ambience by a sputtering method, comprising the step of sputtering a target containing at least any one type of additive metal selected from the group consisting of Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd, while supplying an oxidation gas that has oxygen atoms in its chemical structure into the vacuum ambience, thereby making the conductive film contain the additive metal therein.

The present invention is the method for forming a conductive film, wherein the conductive film is formed on any one or both of a silicon layer surface and a glass substrate by using the object to be film formed in which any one or both of the silicon layer and the glass substrate is exposed at least a part of a surface of the object.

The present invention is the method for forming a conductive film, wherein the oxygen gas is introduced such that a ratio of a partial pressure of an oxygen gas to a total pressure of the vacuum ambience is 0.1% or more and 20% or less, thereby the conductive film contain 0.1 or more atom % Ti therein, and Ti is selected as the additive metal, and the oxygen gas is used as the oxidation gas.

The present invention is the method for forming a conductive film, wherein the oxygen gas is introduced such that a ratio of a partial pressure of an oxygen gas to a total pressure of the vacuum ambience is 0.1% or more and 20% or less, thereby the conductive film is made include 0.1 or more atom % Zr therein, and Zr is selected as the additive metal, and the oxygen gas is used as the oxidation gas.

The present invention is the method for forming a conductive film, wherein the conductive film is formed on a surface of a transparent conductive film by using the object to be film formed where the transparent conductive film is exposed at least a part of a surface thereof.

The present invention is a thin-film transistor includes a first conductive film formed on a surface of a thin film transistor being used as an object to be film formed, the thin film transistor being used as the object to be film formed including a gate electrode; a drain region containing silicon as a main component; and source region containing silicon as a main component, and through which a current flows between the source region and the drain region when voltage is applied to the gate electrode, while voltage is applied to the drain region and the source region. The first conductive film is formed on any one or both of a surface of the drain region and a surface of the source region of the object to be film formed; and the first conductive film is formed by sputtering a target containing at least any one type of additive metal selected from the group consisting of Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd, while an oxidation gas that has oxygen atoms in its chemical structure is supplied into the vacuum ambience.

The present invention is a thin-film transistor, wherein Ti is selected as the additive metal, an oxygen gas is used as the oxidation gas, and the oxygen gas is introduced such that a ratio of a partial pressure of the oxidation gas to a total pressure of the vacuum ambience is 0.1% or more and 20% or less, and thereby 0.1 or more atom % Ti is contained in the first conductive film.

The present invention is a thin-film transistor, wherein Zr is selected as the additive metal, an oxygen gas is used as the oxidation gas, and the oxygen gas is introduced such that a ratio of a partial pressure of the oxidation gas to a total pressure of the vacuum ambience is 0.1% or more and 20% or less, and thereby 0.1 or more atom % Zr is contained in the first conductive film.

The present invention is a panel with a thin-film transistor including a substrate with a thin-film transistor and a transparent conductive film arranged on a surface of the substrate, the thin-film transistor including a gate electrode; a drain region containing silicon as a main component; and a source region containing silicon as a main component. A current flows between the source region and the drain region when voltage is applied to the gate electrode, while voltage is applied to the drain region and the source region, and a first conductive film is formed on any one or both of a surface of the drain region and a surface of the source region, and is formed on a surface of the transparent conductive film respectively, by using the substrate as an object to be film formed in a state where the thin-film transistor is placed. The first conductive film is formed by sputtering a target containing at least any one type of additive metal selected from the group consisting of Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd, while an oxidation gas that has oxygen atoms in its chemical structure is supplied into the vacuum ambience.

The present invention is a panel with a thin-film transistor includes a substrate, a thin-film transistor and a transparent conductive film arranged on a surface of the substrate, the thin-film transistor including agate electrode, a drain region containing silicon as a main component, and a source region containing silicon as a main component, the thin-film transistor being configured such that a current flows between the source region and the drain region when a voltage is applied to the gate electrode while a voltage is applied to the drain region and the source region. The panel with the thin-film transistor includes a first conductive film provided on any one or both of a surface of the drain region and a surface of the source region; a copper film containing copper as a main component is provided on a surface of the first conductive film; and a second conductive film is provided on a surface of the copper film. The first and second conductive films are formed by using the substrate as an object to be film formed in a state such that the thin-film transistor is arranged and the first and second conductive films are formed by sputtering a target containing at least any one type of additive metal selected from the group consisting of Ti, Zr, Hf, V, Nb, Ta, Cr, Mo, W, Mn, Fe, Ru, Os, Co, Ni, Si, Ag, Zn, Sn, B, C, Al, Si, La, Ce, Pr, and Nd, while an oxidation gas is supplied that has oxygen atoms in its chemical structure into the vacuum ambience.

The present invention is a panel with a thin-film transistor, wherein Ti is selected as the additive metal; an oxygen gas is used as the oxidation gas; and the oxygen gas is introduced such that a ratio of a partial pressure of the oxygen gas to a total pressure of the vacuum ambience is 0.1% or more and 20% or less; and thereby, 0.1 or more atom % Ti is contained in the second conductive film.

The present invention is a panel with a thin-film transistor, wherein Zr is selected as the additive metal; an oxygen gas is used as the oxidation gas; and the oxygen gas is introduced such that a ratio of a partial pressure of the oxygen gas to a total pressure of the vacuum ambience is 0.1% or more and 20% or less; and thereby, 0.1 or more atom % Zr is contained in the second conductive film.

The present invention is a method for manufacturing a thin-film transistor having a conductive film being in contact with a silicon layer, comprising the step of sputtering a target in a vacuum ambience so as to form the conductive film, the target containing copper as a main component and containing at least any one of additive metal selected from the group consisting of Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd, while an oxidation gas that has oxygen atoms in its chemical structure is introduced into the vacuum ambience.

The present invention is a method for manufacturing a thin-film transistor having a conductive film being in contact with a transparent conductive film. The method includes the step of sputtering a target in a vacuum ambience so as to form the conductive film, the target containing copper as a main component and containing at least any one of additive metal selected from the group consisting of Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd, while supplying an oxidation gas into the vacuum ambience and the oxidation gas has oxygen atoms in its chemical structure.

The present invention is a method for manufacturing a thin-film transistor having a conductive film being in contact with a glass substrate, The method includes the step of sputtering a target in a vacuum ambience in order to form the conductive film, the target containing copper as a main component and containing at least any one type of additive metal selected from the group consisting of Ti, Zr, Hf, V, Nb, Ta, Cr, Mo, W, Mn, Fe, Ru, Os, Co, Ni, Si, Ag, Zn, Sn, B, C, Al, Si, La, Ce, Pr, and Nd, while supplying an oxidation gas that has oxygen atoms in its chemical structure into the vacuum ambience.

The present invention is a method for manufacturing a thin-film transistor having a conductive film being in contact with a silicon layer and a transparent conductive film. The method includes the step of sputtering a target in a vacuum ambience to form the conductive film, while supplying an oxidation gas that has oxygen atoms in its chemical structure into the vacuum ambience, the target containing copper as a main component and at least any one of additive metal selected from the group consisting of Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd.

The present invention is a method for manufacturing a thin-film transistor, the thin-film transistor including a silicon layer containing silicon as a main component, a first conductive film being in contact with the silicon layer, a copper film containing copper as a main component and formed on a surface of the first conductive film, and a second conductive film formed on a surface of the copper film, the second conductive film being in contact with a transparent conductive film. The method includes the step of sputtering a target in a vacuum ambience to form the first and second conductive films, while supplying an oxidation gas that has oxygen atoms in its chemical structure into the vacuum ambience, the target containing copper as a main component and at least any one type of additive metal selected from the group consisting of Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd.

The present invention is a method for manufacturing a thin-film transistor, wherein the oxidation gas is introduced such that a ratio of a partial pressure of the oxidation gas to a total pressure of the vacuum ambience is 0.1% or more and 20% or less for performing the sputtering.

In the present invention, a "main component" means a component that has a content of 50 atom % or more. Accordingly, a target containing copper as a main component contains 50 atom % or more copper, and a conductive film containing copper as a main component contains 50 atom % or more copper.

If a first and a second conductive films are electrically connected to each other, the first and second conductive films may be integrated or another conductive film, (such as, a pure copper film), may be positioned closely between the first and second conductive films.

According to the present invention, a conductive film having low resistance and high adhesiveness to an object to be film formed is obtained. When the conductive film is formed so as to be closely in contact with a silicon layer, diffusion of copper to the silicon layer does not occur. When a conductive film is formed so as to be closely in contact with a transparent conductive film, contact resistance to the transparent conductive film is low. Thus, the conductive film of the present invention is suited for a film that is closely in contact with a silicon layer and a transparent conductive film, specifically for a conductive film of a source electrode and a drain electrode.

BRIEF DESCRIPTION OF THE DRAWINGS

FIG. 1 is a cross sectional view illustrating an example of a film forming device used in the present embodiment.

FIGS. 2(a) to 2(c) are cross sectional views illustrating steps to form a conductive film and a copper film.

FIGS. 7(a) to 7(d) are cross sectional views illustrating first half steps of a process for manufacturing TFT panel.

FIGS. 14(a) to 14(e) are cross sectional views illustrating first half steps of a process for manufacturing a fourth example of TFT.

DETAILED DESCRIPTION OF THE INVENTION

Figure 3:
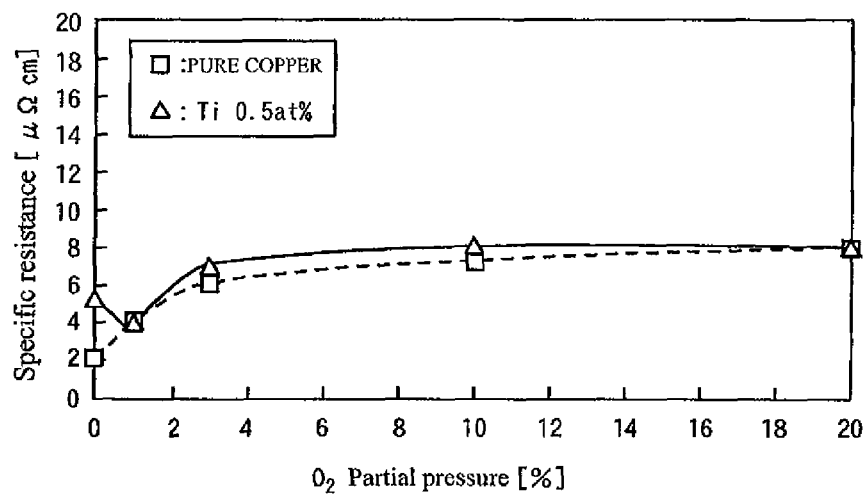
FIG. 3 is a graph illustrating the relationship between oxygen gas partial pressure and specific resistance (Ti).

According to the present invention, a process to form a conductive film will be described in detail.

Reference numeral 1 in FIG. 1 shows one example of a film forming device used for the present invention. The film forming device 1 has a first film forming chamber 2 made of a vacuum chamber, to which a vacuum evacuation system 9, a sputter gas supply system 6, and an oxygen gas supply system 8 are connected.

In order to form a conductive film using this film forming device 1, first, the inside of the first film forming chamber 2 is vacuum evacuated by the vacuum evacuation system 9; a sputter gas and an oxidation gas (in this case, an oxygen gas) are introduced from the sputter gas supply system 6 and the oxygen gas supply system 8, respectively, while continuing the vacuum evacuation; and a first vacuum ambience with a predetermined pressure that includes the oxygen gas is formed.

Reference numeral 21 in FIG. 2(a) shows an object to be film formed in which a silicon layer 23 (in this case, an amorphous silicon layer) is formed on the surface of a substrate 22, and the object to be film formed 21 is carried in the inside of the first film forming chamber 2, while the first vacuum ambience is maintained.

A substrate holder 7 and a target section 10 are arranged so as to face each other inside the first film forming chamber 2; and the object to be film formed 21 is held by the substrate holder 7 with a surface on which the silicon layer 23 is formed being directed to the target section 10.

A heating means 4 is positioned on the back side of the substrate holder 7; and the object to be film formed 21 on the substrate holder 7 is heated to a predetermined film formation temperature by energizing the heating means 4.

The target section 10 includes a main target 11 that contains copper as a main component, and a sub-target 12 that contains an additive metal (in this case, Ti or Zr) as a main component.

The main target 11 is plate-shaped and is positioned with one surface thereof facing toward the substrate holder 7. The sub-target 12 is smaller than the main target 11 in planar shape, and positioned on the surface of the main target 11 that faces the substrate holder 7. The main target 11 and sub-target 12 are connected to a power source 5 positioned outside the vacuum chamber 2.

A magnetic field formation device 14 is positioned on the back surface of the main target 11. When a voltage is applied to both of the main target 11 and sub-target 12 by the power source 5, both of the main target 11 and sub-target 12 are magnetron sputtered; sputter particles of copper and sputter particles of additive metal are respectively emitted; and then, these sputter particles reach the surface of the object to be film formed 21.

The planar shape of the sub-target 12 is smaller than the planar shape of the main target 11 and emission amount of sputter particles of the additive metal is less than that of sputter particles of the copper. Thus, emission amount of copper sputter particles that reach the object to be film formed 21 are greater than that of sputter particles of the additive metal. Then, a conductive film including the copper as a main component and the additive metal grows on the surface of the silicon layer 23 (FIG. 2(b)).

The method for film formation of the present invention can be used not only when the conductive film 25 is formed on the surface of the silicon layer 23 but also when the conductive film 25 is formed on the surface of a glass substrate.

While the conductive film 25 is growing, if the object to be film formed 21 is maintained at a film formation temperature described above, the adhesiveness of the conductive film 25 to the silicon layer 23 or a substrate 22 (e.g., glass substrate) becomes stronger.

A second film forming chamber 3 consisting of a vacuum chamber is connected to the first film forming chamber 2. The vacuum evacuation system 9 and the sputter gas supply system 6 are connected to the second film forming chamber 3; the inside of the second film forming chamber 3 is vacuum evacuated by the vacuum evacuation system 9; then, a sputter gas is supplied from the sputter gas supply system 6 while the vacuum evacuation is continued; and a second vacuum ambience without oxygen gas is formed inside the second film forming chamber 3.

After growing of the conductive film 25 to a predetermined film thickness, a part of the object to be film formed 21 is extracted from the film forming apparatus 1 for an "adhesion test", a "specific resistance test", an "adhesion, specific resistance, and diffusion test" and "a type of additive metal" to be described below; the part of the object to be film formed is carried in a heating device (not illustrated) and then heat treated (anneal treated); and the rest of the object to be film formed 21 is carried in the inside of the second film forming chamber 3 while the second vacuum ambience is maintained.

A copper target 15 containing copper as a main component is positioned inside the second film forming chamber 3. When the copper target 15 is sputtered and applied with a negative voltage to the copper target 15 such that the second film forming chamber 3 is set in a ground potential while the second vacuum ambience is maintained, a copper film containing copper as a main component without additive metal is grown on the surface of the conductive film 25.

FIG. 2(c) shows a state such that a copper film 26 is formed. The object to be film formed 21 is extracted from the film forming apparatus 1, and used for an "electrode evaluation test" described later.

Embodiment

First, a case in which Ti is used as an additive metal is discussed.

<Adhesion Test>

A copper target (purity of 99.9 atom % or greater) having a diameter of 7 inches, as the main target 11, and a target containing Ti, as the sub-target 12, are used. The conductive film 25 is formed in close contact with the surface of a glass substrate by changing the content of Ti in the conductive film 25, the oxygen partial pressure at film formation, and a heating temperature (after-anneal temperature) at anneal treatment; then, 125 types of test specimens are prepared.

The film formation conditions include the aim film thickness of the conductive film 25 to be 300 nm; Ar gas as the sputter gas; and the total pressure of 0.4 Pa for the inside of the first film forming chamber 2.

The content of Ti in the conductive film 25, the ratio of an oxygen partial pressure to the total pressure at the film formation, and the after-anneal temperature are shown in Table 1 as mentioned below.

TABLE 1

Adhesion test (Ti)

| Additive-element | Ti content [at %] | Partial pressure of additive O$_2$ [%] | After-anneal temperature | | | | |
|---|---|---|---|---|---|---|---|
| | | | as depo. | 250 | 300 | 400 | 450 |
| Ti | 0 | 0 | 0/100 | 0/100 | 0/100 | 0/100 | 0/100 |
| | | 0.1 | 3/100 | 2/100 | 7/100 | 9/100 | 11/100 |
| | | 3.0 | 27/100 | 28/100 | 31/100 | 34/100 | 39/100 |
| | | 10.0 | 45/100 | 45/100 | 52/100 | 58/100 | 59/100 |
| | | 20.0 | 66/100 | 69/100 | 70/100 | 81/100 | 84/100 |
| | 0.1 | 0 | 13/100 | 12/100 | 17/100 | 20/100 | 21/100 |
| | | 0.1 | 98/100 | 98/100 | 97/100 | 99/100 | 98/100 |
| | | 3.0 | 93/100 | 100/100 | 100/100 | 100/100 | 100/100 |
| | | 10.0 | 100/100 | 100/100 | 100/100 | 100/100 | 100/100 |
| | | 20.0 | 100/100 | 100/100 | 100/100 | 100/100 | 100/100 |
| | 0.5 | 0 | 20/100 | 23/100 | 25/100 | 24/100 | 27/100 |
| | | 0.1 | 98/100 | 100/100 | 100/100 | 100/100 | 100/100 |
| | | 3.0 | 100/100 | 100/100 | 100/100 | 100/100 | 100/100 |
| | | 10.0 | 100/100 | 100/100 | 100/100 | 100/100 | 100/100 |
| | | 20.0 | 100/100 | 100/100 | 100/100 | 100/100 | 100/100 |
| | 1.0 | 0 | 41/100 | 44/100 | 47/100 | 46/100 | 48/100 |
| | | 0.1 | 100/100 | 100/100 | 100/100 | 100/100 | 100/100 |
| | | 3.0 | 100/100 | 100/100 | 100/100 | 100/100 | 100/100 |
| | | 10.0 | 100/100 | 100/100 | 100/100 | 100/100 | 100/100 |
| | | 20.0 | 100/100 | 100/100 | 100/100 | 100/100 | 100/100 |
| | 10 | 0 | 76/100 | 79/100 | 77/100 | 75/100 | 74/100 |
| | | 0.1 | 100/100 | 100/100 | 100/100 | 100/100 | 100/100 |
| | | 3.0 | 100/100 | 100/100 | 100/100 | 100/100 | 100/100 |
| | | 10.0 | 100/100 | 100/100 | 100/100 | 100/100 | 100/100 |
| | | 20.0 | 100/100 | 100/100 | 100/100 | 100/100 | 100/100 |

"as depo." in above Table 1 indicates a case in which heat treatment is not performed after film formation of the conductive film 25. A case in which Ti is zero means the case in which the sub-target is not placed on the main target and only the main target is sputtered. For the obtained conductive film, the "adhesion" is examined under the conditions described below.

<Adhesion>

A total of 100 pieces of cut-squares each with 1 mm square, in 10 lines×10 rows are formed on the surface where the conductive film 25 of the glass substrate is formed, by a cutter knife having a sharp tip; and an adhesive tape (scotch tape) was adhered to the conductive film 25; and thereafter, adhesion was evaluated by the number of residual films when the adhesive tape was peeled off. When all of cut-squares were delaminated, the number was 0/100. When no cut-square is removed, the number is 100/100 because of high adhesion. Thus, the larger the number of numerator is, the higher the adhesion becomes. The results are described in Table 1 above.

As is evident from Table 1 above, when an oxygen gas is not introduced at the film formation, a part of the conductive film is removed during the adhesion test even if the conductive film contained 10 atom % of Ti. However, when an oxygen gas is introduced at the film formation, the conductive film is not removed and is almost left intact even though the conductive film contained only 0.1 atom % of Ti.

Thus, it is found that when an oxygen gas is introduced at the conductive film formation, a conductive film having excellent adhesion can be obtained. In addition, when the conductive film is formed while the glass substrate is maintained at a film formation temperature of 120° C. or higher, the adhesion is significantly higher than that when the glass substrate is not heated at the film formation.

The oxygen content of the conductive film of each test specimen is measured by the AES method (Auger Electron Spectroscopy). It is found that when partial pressure of the additive oxygen at the film formation is in the range of 0.1 to 20%, the oxygen content in the conductive film is 0.2 to 40 atom %.

<Specific Resistance Test>

Next, in the same conditions as those of the "adhesion test" described above other than the after-anneal temperature changed to 350° C., the conductive film including 0 atom % of Ti content (pure copper) and the conductive film including 0.5 atom % of Ti content are formed on the surface of the glass substrate; and the specific resistance values of the formed conductive films are measured. The measurement result is shown in FIG. 3. The horizontal axis in FIG. 3 shows the ratio of the oxygen partial pressure to the total pressure in the vacuum chamber and the vertical axis shows the specific resistance.

As is evident from FIG. 3, the alloy film including Ti contained in copper has the smaller difference in specific resistance compared with the copper film formed by sputtering pure copper target.

In addition, when the oxygen partial pressure at the film formation exceeded zero and the ratio thereof to the total pressure of the vacuum ambience is within the range of 1% or less, the specific resistance is lower than that of the alloy film when the conductive film is formed in the conditions with the oxygen partial pressure being zero.

It is considered that this results from positive separation of Cu from oxides that were formed by reaction between Ti and $O_2$, because Cu is not dissolved into Ti and the reactivity between Cu and $O_2$ is low. It is observed that when the ratio of oxygen partial pressure to the total pressure of the vacuum ambience exceeds 1%, an increase in resistance is caused by oxidization of Cu.

As described above, when the pure copper target is used, the conductive film has a low resistance value but poor adhesion. Therefore, it is found that when Ti is used as an additive metal, if the ratio of oxygen partial pressure to the total pressure of the vacuum ambience at the film formation exceeding 0 and 20% or less, a conductive film having the equivalent specific resistance but excellent adhesion can be obtained compared to the case in which the pure copper target is used.

Figure 4:
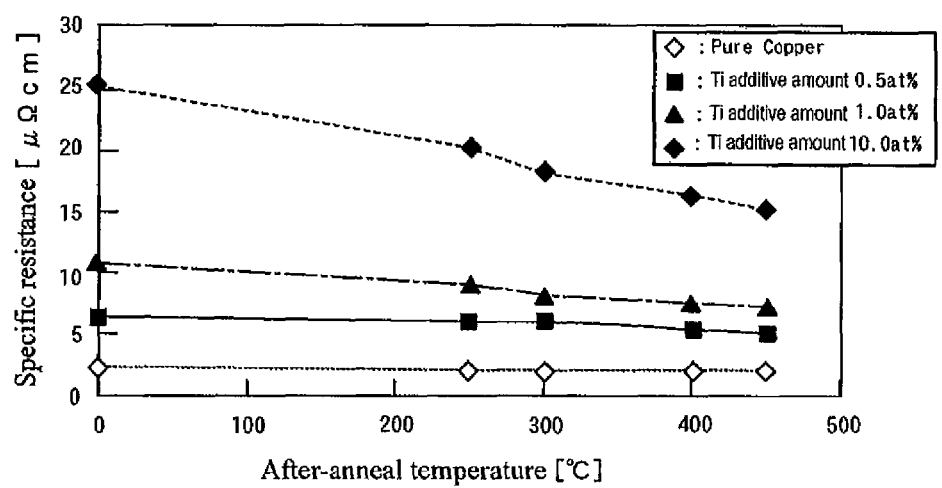
FIG. 4 is a graph illustrating the relationship between after-anneal temperature and specific resistance (Ti).

For reference, the conductive film is formed with each of the content of Ti and the after-anneal temperature being changed without introducing an oxygen gas at the film formation to prepare test specimens, and then the specific resistance of the conductive film is measured. The measurement result is shown in FIG. 4.

<Adhesion, Specific Resistance, and Diffusion Test>

Next, the contents of Ti are specified as 0 atom %, 0.1 atom %, 3.0 atom %, 10 atom %, and 20 atom %; the ratios of oxygen partial pressure to the total pressure of the vacuum ambience are specified as 0%, 0.1%, 3.0%, 10%, and 20%; and under the same conditions as that of the "adhesion test" above except for the after-anneal temperature of 450° C. specified, the conductive films are formed on the surface of the glass substrate and the surface of the silicon layer (Si layer); and then, 50 types of test specimens in total are prepared.

Among these test specimens, for test specimens in which the conductive film is formed on the surface of the glass substrate, the "adhesion test" as mentioned above and the specific resistance measurement of the conductive film are performed. Moreover, for test specimens in which the conductive film is formed on the surface of the Si layer, the occurrence of copper diffusion to the Si layer is examined. The occurrence of the copper diffusion to the Si layer is examined by observing the surface of the Si layer after removing the conductive film by etching, with an electron microscope.

Figure 5:
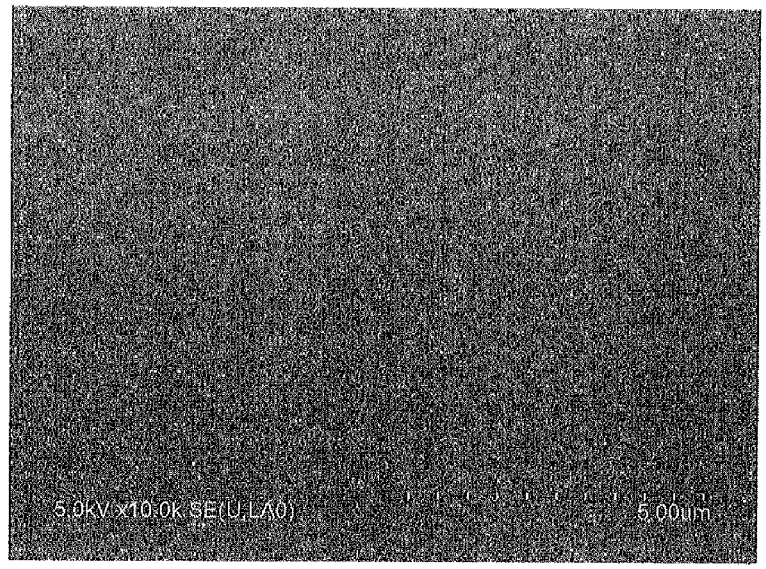
FIG. 5 is an electron microscope photograph showing diffusibility of a conductive film to a silicon layer.
Figure 6:
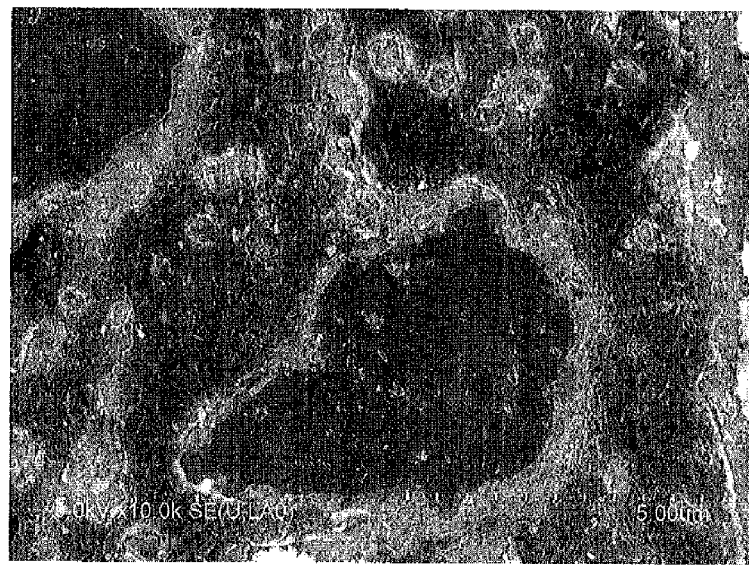
FIG. 6 is an electron microscope photograph illustrating diffusibility of a copper film to the silicon layer.

The measurement results of the "adhesion test" and the "specific resistance" and the result of the occurrence of the copper diffusion are described in Table 2 shown below; the electron microscope photograph of the surface of the silicon layer that the conductive film is formed under the condition of the Ti content of 3 atom % and the ratio of oxygen partial pressure of 3%, is shown in FIG. 5; and the electron microscope photograph when the conductive film is formed under the condition of the zero Ti content and the oxygen pressure of 0% when sputtering is performed, is shown in FIG. 6.

TABLE 2

Adhesion, specific resistance and diffusion test (Ti)

Film thickness: 300 nm
After 450° C. anneal

| Additive element | Content [at %] | Partial pressure of additive $O_2$ [%] | Specific resistance [μΩ cm] | Adhesion | Diffusion to Si |
|---|---|---|---|---|---|
| Ti | 0 | 0 | 2.1 | 0/100 | Occurrence |
| | | 0.1 | 3.1 | 11/100 | Occurrence |
| | | 3.0 | 5.8 | 39/100 | Occurrence |
| | | 10.0 | 7.2 | 59/100 | Occurrence |
| | | 20.0 | 8.0 | 84/100 | Occurrence |
| | 0.1 | 0 | 4.5 | 21/100 | None |
| | | 0.1 | 3.1 | 98/100 | None |
| | | 3.0 | 4.6 | 100/100 | None |
| | | 10.0 | 6.8 | 100/100 | None |
| | | 20.0 | 7.9 | 100/100 | None |
| | 3 | 0 | 5.3 | 27/100 | None |
| | | 0.1 | 3.9 | 100/100 | None |
| | | 3.0 | 4.9 | 100/100 | None |
| | | 10.0 | 6.5 | 100/100 | None |
| | | 20.0 | 8.1 | 100/100 | None |
| | 10 | 0 | 7.3 | 48/100 | None |
| | | 0.1 | 4.6 | 100/100 | None |
| | | 3.0 | 5.0 | 100/100 | None |
| | | 10.0 | 5.3 | 100/100 | None |
| | | 20.0 | 8.1 | 100/100 | None |
| | 20 | 0 | 15 | 74/100 | None |
| | | 0.1 | 4.8 | 100/100 | None |
| | | 3.0 | 4.8 | 100/100 | None |
| | | 10.0 | 5.8 | 100/100 | None |
| | | 20.0 | 8.2 | 100/100 | None |

As is evident from Table 2, FIG. 5 and FIG. 6, when Ti content is zero, copper diffusion to the silicon layer occurred. However, when Ti content is 0.1 atom % or more, no copper diffusion to the silicon layer occurred.

With regard to the adhesion to the glass substrate, it is confirmed that when the Ti content in the conductive film is 0.1 atom % or more and the ratio of oxygen gas partial pressure to the total pressure of the vacuum ambience is 0.1% or more, nearly 100% of the conductive film is not peeled.

When the ratio of oxygen gas partial pressure to the total pressure of the vacuum ambience is 20%, the specific resistance is higher than when the ratio is less than 20%. This specific resistance value has no problem in practice, as the conductive film constituting a source electrode and a drain electrode.

However, when the ratio of oxygen gas partial pressure exceeds 20% of the total pressure and the sputter gas partial pressure decreases, the sputter speed decreases so that the efficiency of film formation decreases. Thus, it is preferable that the conductive film is formed under the condition such that the ratio of oxygen gas partial pressure to the total pressure of the vacuum ambience is 20% or less.

Further, the specific resistance tended to increase as the oxygen gas partial pressure increased in the range such that the ratio of oxygen gas partial pressure to the total pressure of the vacuum ambience exceeds 3.0%. However, the specific resistance value was a minimum value when the ratio of oxygen gas partial pressure was in the range of 0 to 3%, as illustrated in Table 2.

Accordingly, it is found that the ratio of oxygen gas partial pressure to the total pressure at the formation of the conductive film 25 is in the range exceeding zero and 3% or less, a conductive film having a high adhesion and a low specific resistance value can be obtained.

<Electrode Evaluation Test>

Next, using of a silicon substrate of which a silicon layer is exposed on a surface thereof and a glass substrate of which glass is exposed on a surface thereof, electrodes made of a conductive film (film thickness 350 nm) are prepared on the surface of the silicon substrate and the surface of the glass substrate, by changing the Ti content. Then, six types of test specimens are obtained.

Furthermore, conductive films having film thickness of 50 nm are respectively prepared on the surface of the silicon substrate and the surface of the glass substrate by changing the Ti content. Thereafter, pure copper film having film thickness of 300 nm are respectively formed on the surface of each conductive film in order to form electrodes consisting of the conductive film and the pure copper film. Then, six types of test specimens are obtained.

Furthermore, as a comparative example, electrodes made of a pure copper film having film thickness of 350 nm are prepared on the surface of a silicon substrate and the surface of a glass substrate. The pure copper film is formed by sputtering the pure copper target without introducing an oxygen gas into the vacuum chamber (zero oxygen partial pressure).

With regard to the electrode formed on the surface of the glass substrate, specific resistance and adhesion thereof are measured. For the electrode formed on the surface of the silicon substrate, occurrence of copper element's diffusion to a silicon layer is examined and characteristics as an electrode are evaluated. The measurement results are described with the Ti content of the conductive film; and the oxygen gas partial pressure when the conductive film is formed is shown in Table 3 below.

As is evident from Table 3 described above, the electrode made of the pure copper film has low specific resistance; however, the adhesion is not present; and moreover, a copper element is diffused to the silicon layer.

In contrast, for the conductive film containing Ti, the copper element did not diffuse to the silicon layer. The adhesion is also excellent. When the electrode made of only the conductive film containing Ti, the specific resistance is high which is not, practically speaking, a problem.

The electrode in which the thickness of a conductive film containing Ti is reduced and accordingly pure copper film is grown on the conductive film, and the electrode has almost the same specific resistance to that of the electrode that is made of the pure copper film.

Therefore, it is most preferable that the electrode is composed of two or more layers including a conductive film containing both oxygen and an additive metal and a conductive film (e.g., pure copper film) containing neither oxygen nor an additive metal; and the conductive film containing both oxygen and an additive metal is provided in the interface of the silicon layer.

<Contact Resistance to ITO>

According to the formation method of the present invention, conductive films having different Ti contents are formed on the surface of a glass substrate; and thin film electrodes were prepared by patterning the conductive films; thereafter, ITO having a film thickness of 150 nm is formed as a transparent electrode on the surface of the glass substrate where the thin film electrode is formed, and then three types of test specimens are prepared by patterning ITO.

As an object to be compared, in place of the conductive film, thin film electrodes are prepared by forming an Al film and a pure copper film, respectively; and a transparent electrode consisting of ITO is prepared on the surface of the glass substrate where the thin film electrode is formed.

For each of the test specimens including test specimens that were heat treated at an after-anneal temperature of 250° C. and other test specimens (as depo.) that were not heat treated, the contact resistance between the thin film electrode and the transparent electrode was measured. The measurement result is described with the Ti content and the oxygen partial pressure at the sputtering in Table 4 below.

TABLE 3

| | | Electrode evaluation | | | |
|---|---|---|---|---|---|
| | | | Total film thickness: 350 nm | | |
| | | | After 450° C. anneal | | |
| Film composition | Content [at %] | Partial pressure of additive $O_2$ [%] | Specific resistance [$\mu\Omega$ cm] | Adhesion | Diffusion to Si |
| Cu/Si layer | 0 | 0 | 2.1 | 0/100 | Occurrence |
| Cu—Ti/Si layer | 0.1 | 3.0 | 4.6 | 100/100 | None |
| | 3 | 3.0 | 4.9 | 100/100 | None |
| | 10 | 3.0 | 5.0 | 100/100 | None |
| Cu/Cu—Ti/Si layer* | 0.1 | 3.0 | 2.2 | 100/100 | None |
| | 3 | 3.0 | 2.1 | 100/100 | None |
| | 10 | 3.0 | 2.1 | 100/100 | None |

*Cu film is formed without addition of oxgen

TABLE 4

Contact resistance to ITO (Ti)

| Film composition | Ti content [at %] | Partial pressure of additive O₂ [%] | Film thickness of ITO: 150 nm Contact resistance [Ω] | |
|---|---|---|---|---|
| | | | as depo. | After 450° C. anneal |
| ITO/Al/glass | — | — | 138.5 | 441.9 |
| ITO/Cu/glass | — | — | 5.8 | 29.0 |
| ITO/Cu—Ti/glass | 0.1 | 3.0 | 6.3 | 30.3 |
| | 3 | 3.0 | 5.8 | 29.7 |
| | 10 | 3.0 | 5.9 | 29.4 |

As is evident from Table 4 above, the thin film electrode consisting of the conductive film containing Ti, has low contact resistance to the transparent electrode, equivalent to that of the thin film electrode consisting of the pure copper film. In contrast, the thin film electrode consisting of the Al film has high contact resistance as compared to the pure copper film and the conductive film formed by the present invention. More particularly, the contact resistance after the heat treatment is so high that it cannot be used for a TFT substrate. Accordingly, it is confirmed that the conductive film formed by the present invention not only has excellent adhesion, specific resistance, and diffusion preventive property, but also has low contact resistance value to a transparent electrode, such as, ITO.

<Type of Additive Metals>

Next, the conductive film containing 1 atom % of additive metal is prepared by sputtering in the same conditions as those in the "adhesion test" described above other than the use of each additive metal described in Table 5 below as a sub-target substituting for Ti. The types of additive elements and the oxygen partial pressure at the sputtering in the vacuum chamber are described in Table 5 below.

TABLE 5

Type of additive metals

| Additive element [each 1 at %] | Additive gas partial pressure of O₂ [%] | After 350° C. anneal | | After 450° C. anneal | |
|---|---|---|---|---|---|
| | | Specific resistance | Adhesion | Specific resistance | Adhesion |
| — | — | 2.0 | 0/100 | 2.0 | 0/100 |
| Ag | 0.1 | 2.4 | 100/100 | 2.4 | 100/100 |
| B | 5 | 3.3 | 100/100 | 3.4 | 100/100 |
| Bi | 3 | 4.7 | 100/100 | 4.6 | 100/100 |
| C | 10 | 5.3 | 100/100 | 5.2 | 100/100 |
| Ce | 2 | 4.3 | 100/100 | 4.2 | 100/100 |
| Ce | 0 | 8.8 | 54/100 | 8.7 | 53/100 |
| Co | 10 | 4.7 | 100/100 | 4.5 | 100/100 |
| Cr | 5 | 5.5 | 100/100 | 5.3 | 100/100 |
| Fe | 0.5 | 3.8 | 100/100 | 3.5 | 100/100 |
| Hf | 0.1 | 2.9 | 100/100 | 2.8 | 100/100 |
| Hf | 0 | 9.9 | 57/100 | 9.8 | 52/100 |
| Nb | 3 | 4.7 | 100/100 | 4.8 | 100/100 |
| Nb | 0 | 7.5 | 63/100 | 7.3 | 65/100 |
| Os | 1 | 4.8 | 100/100 | 4.4 | 100/100 |
| Ru | 10 | 4.9 | 100/100 | 5 | 100/100 |
| Sn | 20 | 5.6 | 100/100 | 5.3 | 100/100 |
| Ta | 3 | 4.6 | 100/100 | 4.6 | 100/100 |
| Ta | 0 | 7.6 | 55/100 | 7.4 | 52/100 |
| Mo | 5 | 6.8 | 100/100 | 6.7 | 100/100 |
| Mn | 0.5 | 3.6 | 100/100 | 3.5 | 100/100 |
| Ni | 0.1 | 3.9 | 100/100 | 3.8 | 100/100 |
| V | 20 | 6.6 | 100/100 | 6.4 | 100/100 |
| V | 0 | 7.9 | 63/100 | 7.5 | 64/100 |
| W | 10 | 5.5 | 100/100 | 5.5 | 100/100 |
| Zn | 15 | 5.7 | 100/100 | 5.6 | 100/100 |
| Zn | 0 | 6.8 | 55/100 | 6.5 | 57/100 |

A substrate on which an alloy film formed is heat treated at after-anneal temperatures of 350° C. or 450° C. and test specimens are prepared. Then, with regard to alloy films of each test specimens, the measurement of specific resistance and the adhesion test are performed. The results are described in Table 5 above.

As is evident from Table 5 above, in the cases where each additive metal is used, adhesion when oxygen gas is contained improved compared to that when oxygen gas is not contained (oxygen gas partial pressure of 0%) during sputtering.

Similar to the case of Ti shown in FIG. 3, it is confirmed that when the oxygen gas partial pressure during sputtering is performed is set in an optimum range, the specific resistance when the oxygen gas is added decreases compared to that when the oxygen gas is not added.

Due to these results, it is confirmed that Hf, V, Nb, Ta, Cr, Mo, W, Mn, Fe, Ru, Os, Co, Ni, Bi, Ag, Zn, Sn, B, C, Al, Si, La, Ce, Pr, and Nd can be used as an additive metal, in addition to Ti.

Next, a case in which Zr is used as an additive metal is discussed.

<Adhesion Test>

A copper (purity 99.9 atom % or greater) target having a diameter of 7 inches is used as the main target 11, and a target containing Zr is used as the sub-target 12; and the conductive film 25 is formed in close contact with the surface of a glass substrate by changing the content of Zr included in the conductive film 25, the oxygen partial pressure when the film is formed, and a heating temperature (after-anneal temperature) when anneal treatment is performed. Then, 125 types of test specimens are prepared.

The film formation conditions include: the aim film thickness of the conductive film 25 of 300 nm; the sputter gas as an Ar gas; and the total pressure inside the first film forming chamber 2 of 0.4 Pa. The content of Zr included in the conductive film 25 and the ratio of the oxygen partial pressure to the total pressure for film forming, and the after-anneal temperature are shown in the table 6 below.

TABLE 6

Adhesion test (Zr)

| Additive element | Zr Content [at %] | partial pressure of additive O₂ [%] | After-anneal temperature | | | | |
|---|---|---|---|---|---|---|---|
| | | | as depo. | 250 | 300 | 400 | 450 |
| Zr | 0 | 0 | 0/100 | 0/100 | 0/100 | 0/100 | 0/100 |
| | | 0.1 | 3/100 | 2/100 | 7/100 | 9/100 | 11/100 |
| | | 3.0 | 27/100 | 28/100 | 31/100 | 34/100 | 39/100 |
| | | 10.0 | 45/100 | 45/100 | 52/100 | 58/100 | 59/100 |
| | | 20.0 | 66/100 | 69/100 | 70/100 | 81/100 | 84/100 |
| | 0.1 | 0 | 11/100 | 15/100 | 18/100 | 17/100 | 19/100 |
| | | 0.1 | 97/100 | 99/100 | 98/100 | 98/100 | 99/100 |
| | | 3.0 | 93/100 | 100/100 | 100/100 | 100/100 | 100/100 |
| | | 10.0 | 100/100 | 100/100 | 100/100 | 100/100 | 100/100 |
| | | 20.0 | 100/100 | 100/100 | 100/100 | 100/100 | 100/100 |
| | 0.5 | 0 | 22/100 | 25/100 | 29/100 | 26/100 | 30/100 |
| | | 0.1 | 98/100 | 100/100 | 100/100 | 100/100 | 100/100 |
| | | 3.0 | 100/100 | 100/100 | 100/100 | 100/100 | 100/100 |
| | | 10.0 | 100/100 | 100/100 | 100/100 | 100/100 | 100/100 |
| | | 20.0 | 100/100 | 100/100 | 100/100 | 100/100 | 100/100 |
| | 1.0 | 0 | 43/100 | 34/100 | 38/100 | 40/100 | 35/100 |
| | | 0.1 | 100/100 | 100/100 | 100/100 | 100/100 | 100/100 |
| | | 3.0 | 100/100 | 100/100 | 100/100 | 100/100 | 100/100 |
| | | 10.0 | 100/100 | 100/100 | 100/100 | 100/100 | 100/100 |
| | | 20.0 | 100/100 | 100/100 | 100/100 | 100/100 | 100/100 |
| | 10 | 0 | 69/100 | 73/100 | 68/100 | 71/100 | 70/100 |
| | | 0.1 | 100/100 | 100/100 | 100/100 | 100/100 | 100/100 |
| | | 3.0 | 100/100 | 100/100 | 100/100 | 100/100 | 100/100 |
| | | 10.0 | 100/100 | 100/100 | 100/100 | 100/100 | 100/100 |
| | | 20.0 | 100/100 | 100/100 | 100/100 | 100/100 | 100/100 |

The "as depo." shown in Table 6, as mentioned above, refers to the case when heat treatment is not performed after forming the conductive film 25. In the case in which Zr is zero, the sub-target is not placed on the main target and only the main target is sputtered. With regard to the obtained conductive film, the "adhesion" is examined under the conditions described below <Adhesion>

A total of 100 pieces of cut-squares each having 1 mm square, in 10 lines×10 rows are formed on the surface of the object to be film formed where the conductive film 25 is formed, by using a cutter knife having a sharp tip; an adhesive tape (scotch tape) is adhered to the conductive film 25; and thereafter, adhesion is evaluated by the number of residual films when the adhesive tape is peeled off. When all of the cut-squares were delaminated the number is 0/100. When no cut-square is delaminated, the number is 100/100 because of high adhesion. Thus, the larger the number of the numerator means the higher the adhesion. The results are described in Table 6 above.

As is evident from Table 6 above, when oxygen is not introduced at the film formation, a part of the conductive film is removed in the adhesion test even though the conductive film contains 10 atom % Zr. However, when oxygen is introduced at the film formation, the conductive film is not removed and is almost left even though the conductive film contains only 0.1 atom % Zr.

Thus, it is found that when an oxygen gas is introduced at the film formation, a conductive film having excellent adhesion can be obtained. In addition, if the additive metal is Zr, when the conductive film is formed while the substrate was maintained at a film formation temperature of 120° C. or greater, the adhesion is significantly higher than that when the substrate is not heated at the film formation.

The oxygen content of each test specimen's conductive film is measured by an AES method (Auger Electron Spectroscopy). As a result, it is found that a ratio of partial pressure of additive oxygen at the film formation is in the range of 0.1 to 20%, the oxygen content in the conductive film being 0.2 or more and 40 atom % or less.

<Specific Resistance Test>

Figure 11:
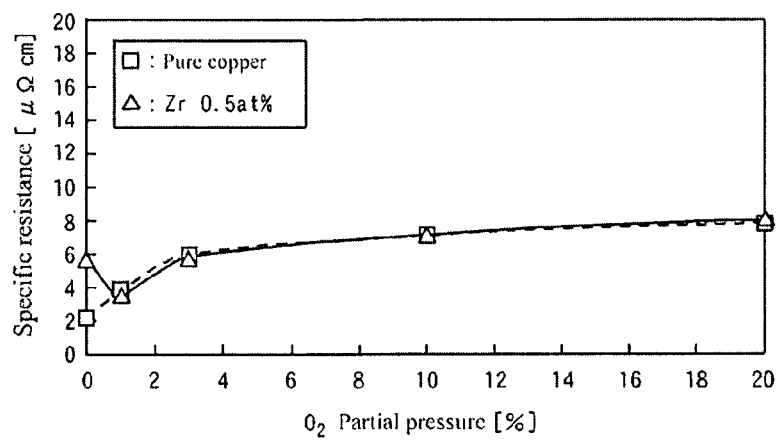
FIG. 11 is a graph illustrating the relationship between oxygen gas partial pressure and specific resistance.

Next, for the test conditions, only the anneal-temperature is changed to 350° C. and other conditions are not changed from the conditions of the "adhesion test" described above; and the conductive films, of which Zr content is 0 atom % (in this case, pure copper) and of which Zr content is 0.5 atom %, are formed on the surface of the glass substrate. The specific resistance values of the conductive films are measured. The measurement result is shown in FIG. 11. The horizontal axis in FIG. 11 indicates the ratio of the oxygen partial pressure to the total pressure in the vacuum chamber; and the vertical axis shows the specific resistance.

As is evident from FIG. 11, the alloy film of which Zr is contained in copper has the smaller difference in specific resistance compared to the copper film formed by sputtering pure copper target.

In addition, when the ratio of oxygen partial pressure to the total pressure of the vacuum ambience at the film formation exceeded zero and is within the range of 1% or less, the specific resistance is lower than that of the alloy film formed under the conditions with the oxygen partial pressure being zero.

It is considered that such results are due from the positive separation of Cu from oxides that were formed by reaction between Zr and O, because Cu is not dissolved into Zr and the reactivity between Cu and $O_2$ is low. It is observed that when the ratio of oxygen partial pressure to the total pressure of the vacuum ambience exceeds 1%, an increase in resistance is caused by oxidization of Cu.

As described above, when the pure copper target is used, the conductive film has a low resistance value but has poor adhesion. Therefore, it is found that when Zr is used as an additive metal, if the ratio of oxygen partial pressure to the total pressure of the vacuum ambience at the film formation is in the range exceeding 0 and 20% or less, a conductive film with the equivalent specific resistance but excellent adhesion can be obtained compared to the case in which the pure copper target is used.

Figure 12:
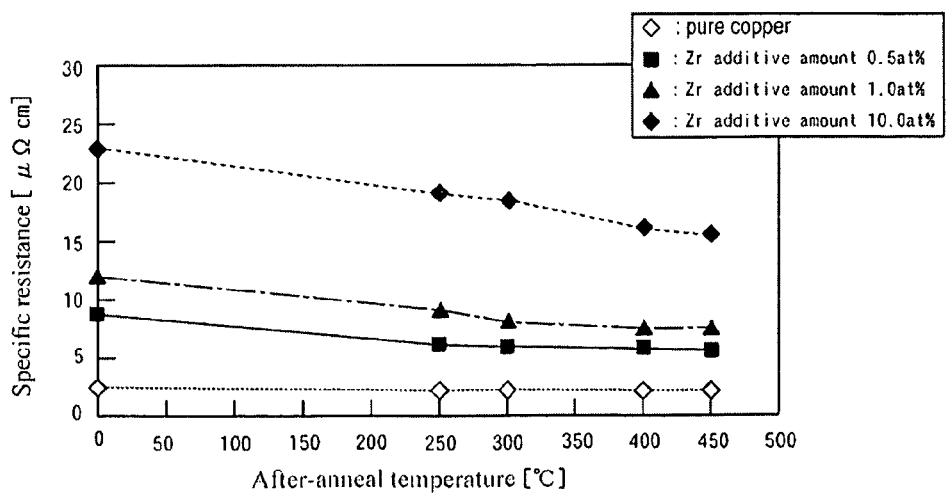
FIG. 12 is a graph illustrating the relationship between after-anneal temperature and specific resistance.

For reference, the conductive film is formed with each of the content of Zr and the after-anneal temperature being changed and without introducing an oxygen gas at the film formation to prepare test specimens. Then, the specific resistance of the conductive film is measured. The measurement result is shown in FIG. 12.

<Adhesion, Specific Resistance, and Diffusion Test>

Next, the contents of Zr are specified as 0 atom %, 0.1 atom %, 3.0 atom %, 10 atom %, and 20 atom %; and the ratios of oxygen partial pressure to the total pressure of the vacuum ambience are specified as 0%, 0.1%, 3.0%, 10%, and 20%. The other conditions are the same conditions as that in the "adhesion test" above except for the after-anneal temperature of 450° C. The conductive films are formed on the surface of the glass substrate and the surface of the silicon layer (Si layer), respectively, and then, 50 types of test specimens in total are prepared.

Among these test specimens, for test specimens in which the conductive film is formed on the surface of the glass substrate, the "adhesion test" as described above, and the specific resistance measurement of the conductive film were performed. Moreover, for test specimens in which the conductive film is formed on the surface of the Si layer, the occurrence of copper diffusion to the Si layer is examined.

The occurrence of the copper diffusion to the Si layer is examined by observing the surface of the Si layer after removing the conductive film by etching, with the use of an electron microscope. The measurement results of the "adhesion test" and the "specific resistance" and the result of the presence of the copper diffusion are described in Table 7 below.

TABLE 7

Adhesion, Specific resistance, and Diffusion test (Zr)

Each film thickness: 300 nm
After 450° C. anneal

| Additive element | Content [at %] | partial pressure of additive $O_2$ [%] | Specific resistance [$\mu\Omega$ cm] | Adhesion | Diffusion to Si |
|---|---|---|---|---|---|
| Zr | 0 | 0 | 2.1 | 0/100 | Occurrence |
|  |  | 0.1 | 3.1 | 11/100 | Occurrence |
|  |  | 3.0 | 5.8 | 39/100 | Occurrence |
|  |  | 10.0 | 7.2 | 59/100 | Occurrence |
|  |  | 20.0 | 8.0 | 84/100 | Occurrence |
|  | 0.1 | 0 | 4.6 | 19/100 | None |
|  |  | 0.1 | 3.2 | 99/100 | None |
|  |  | 3.0 | 4.7 | 100/100 | None |
|  |  | 10.0 | 6.2 | 100/100 | None |
|  |  | 20.0 | 7.6 | 100/100 | None |
|  | 3 | 0 | 5.1 | 30/100 | None |
|  |  | 0.1 | 3.5 | 100/100 | None |
|  |  | 3.0 | 5.1 | 100/100 | None |
|  |  | 10.0 | 6.4 | 100/100 | None |
|  |  | 20.0 | 7.9 | 100/100 | None |
|  | 10 | 0 | 15.0 | 65/100 | None |
|  |  | 0.1 | 4.5 | 100/100 | None |
|  |  | 3.0 | 5.3 | 100/100 | None |
|  |  | 10.0 | 5.6 | 100/100 | None |
|  |  | 20.0 | 8.2 | 100/100 | None |
|  | 20 | 0 | 15.5 | 76/100 | None |
|  |  | 0.1 | 4.6 | 100/100 | None |
|  |  | 3.0 | 5.2 | 100/100 | None |
|  |  | 10.0 | 6.1 | 100/100 | None |
|  |  | 20.0 | 8.4 | 100/100 | None |

It is clear as shown in Table 7 above, when the Zr content was zero, copper diffusion to the silicon layer occurred. However, when Zr of 0.1 atom % or more is contained, the surface of the silicon layer after removing the conductive film by etching, is smooth similarly to that shown in FIG. 5. Thus, the copper diffusion to the silicon layer is not observed.

Further, it was confirmed that when the Zr content is 0.1 atom % or more and the ratio of oxygen gas partial pressure to the total pressure of the vacuum ambience is 0.1% or more, nearly 100% of the conductive film is not removed from the glass substrate; and thus, the adhesion is high.

When the ratio of oxygen gas partial pressure to the total pressure of the vacuum ambience is 20%, the specific resistance is higher than that when the ratio thereof is less than 20%. The specific resistance value has no problem practically, as the conductive film constituting a source electrode and a drain electrode. However, when the ratio of oxygen gas partial pressure to the total pressure exceeds 20% and the sputter gas partial pressure decreases, the sputter speed decreases; and subsequently, the efficiency of film formation decreases. Thus, it is preferable that the conductive film is formed under the condition with the ratio of oxygen gas partial pressure to the total pressure of the vacuum ambience being 20% or less.

Further, the specific resistance had a tendency to increase as the ratio of oxygen gas partial pressure to the total pressure of the vacuum ambience increased in the range of greater than 3%. However, the specific resistance value is at a minimum value when the oxygen gas partial pressure is in the range exceeding 0 and 3% or less, as shown in Table 7 above. Accordingly, it is found that the ratio of oxygen gas partial pressure to the total pressure when the conductive film 25 is formed is in the range exceeding zero and 3% or less, wherein the conductive film having the high adhesion and a low specific resistance can be obtained.

<Electrode Evaluation Test>

Next, using a silicon substrate having a silicon layer exposed on a surface thereof and a glass substrate with glass exposed on a surface thereof, electrodes consisting of a conductive film (film thickness 350 nm) are formed on each surface of the substrates, while the Zr content is changed. Thus, six types of test specimens are obtained.

Aside from this, conductive films having film thickness of 50 nm are prepared on the surface of the silicon substrate and the surface of the glass substrate surface, respectively, by changing the Zr content. Thereafter, pure copper film having a film thickness of 300 nm are formed on the surface of each conductive film, respectively, in order to form electrodes consisting of the conductive film and the pure copper film. Thus, six types of test specimens are obtained.

In addition, for a comparison and contrast, electrodes consisting of a pure copper film having a film thickness of 350 nm are prepared on the surface of a silicon substrate and the surface of a glass substrate. The pure copper film is formed by sputtering the pure copper target without introducing an oxygen gas into the vacuum chamber (zero oxygen partial pressure).

With regard to the electrode prepared on the surface of the glass substrate, specific resistance and adhesion thereof are measured and, for the electrode formed on the surface of the silicon substrate, occurrence of the copper element's diffusion to a silicon layer is examined so as to evaluate its characteristics as an electrode. The measurement results are described together with the Zr content of the conductive film, and the oxygen gas partial pressure when the conductive film is formed in Table 8 below.

TABLE 8

Electrode evaluation (Zr)

| Film composition | Content [at %] | Partial pressure of additive O$_2$ [%] | Total film thickness: 350 nm After 450° C. anneal | | |
|---|---|---|---|---|---|
| | | | Specific resistance [μΩ cm] | Adhesion | Diffusion to Si |
| Cu/Si layer | 0 | 0 | 2.1 | 0/100 | Occurrence |
| Cu—Zr/Si layer | 0.1 | 3.0 | 4.7 | 100/100 | None |
| | 3 | 3.0 | 5.1 | 100/100 | None |
| | 10 | 3.0 | 5.3 | 100/100 | None |
| Cu/Cu—Zr/Si layer* | 0.1 | 3.0 | 2.1 | 100/100 | None |
| | 3 | 3.0 | 2.1 | 100/100 | None |
| | 10 | 3.0 | 2.2 | 100/100 | None |

*Cu film is formed without oxygen addition

It is clear as shown in Table 8 above, however, that the electrode consisting of the pure copper film has small specific resistance, the adhesion is not present, and the copper element diffused to the silicon layer.

In contrast, when the conductive film containing Zr is formed on the surface of the substrate, a copper element does not diffuse to the silicon layer and also the adhesion is excellent. When the electrode consisted of only the conductive film containing Zr, the specific resistance is high; however, such high specific resistance has no problem practically.

The electrode in which the thickness of a conductive film containing Zr is reduced and accordingly pure copper film was grown on the conductive film. As such, the electrode has almost the same specific resistance as that when the electrode consisted of the pure copper film.

Therefore, it is most preferable that the electrode is composed of two or more layers including a conductive film containing both oxygen and an additive metal and a conductive film (e.g., pure copper film) containing neither oxygen nor an additive metal, with the conductive film containing both oxygen and an additive metal being provided in the interface between the electrode and the silicon layer.

<Contact Resistance to ITO>

According to the formation method of the present invention, conductive films having different Zr contents are formed on the surface of a glass substrate; thin film electrodes are prepared by patterning the conductive films; thereafter, ITO having a film thickness of 150 nm is formed as a transparent electrode on the surface of the glass substrate where the thin film electrode is formed. Thus, three types of test specimens are prepared by patterning ITO.

As an object to be compared, in place of the conductive film; thin film electrodes are prepared by forming an Al film and a pure copper film respectively; and a transparent electrode consisting of ITO is formed on the surface of the glass substrate where the thin film electrode was formed.

For each of the test specimens including test specimens that were heat treated at an after-anneal temperature of 250° C. and other test specimens (as depo.) that are not heat treated, the contact resistance between the thin film electrode and the transparent electrode is measured. The measurement result is described together with the Zr content and the oxygen partial pressure at the sputtering in Table 9 below.

TABLE 9

Contact resistance to ITO (Zr)

| Film composition | Zr Content [at %] | Partial pressure of additive O$_2$ [%] | ITO film thickness: 150 nm Contact resistance [Ω] | |
|---|---|---|---|---|
| | | | as depo. | After 250° C. anneal |
| ITO/Al/glass | — | — | 138.5 | 441.9 |
| ITO/Cu/glass | — | — | 5.8 | 29.0 |
| ITO/Cu—Zr/glass | 0.1 | 3.0 | 6.5 | 10.2 |
| | 3 | 3.0 | 5.0 | 5.5 |
| | 10 | 3.0 | 5.7 | 15.3 |

As is evident from Table 9 above, the thin film electrode consisting of the conductive film containing Zr has low contact resistance to the transparent electrode, which is equivalent to that of the thin film electrode consisting of the pure copper film. In contrast, the thin film electrode consisting of the Al film has high contact resistance as compared to the pure copper film and the conductive film formed by the present invention. More particularly, the contact resistance after the heat treatment is too high so that it may not be used for a TFT substrate. Accordingly, it is confirmed that the conductive film formed according to the present invention has excellent adhesion, specific resistance, and diffusion preventive property, and also low contact resistance value to a transparent electrode, such as, ITO.

Next, one example of TFT (Thin Film Transistor) of the present invention will be described.

Reference numeral 41 in FIG. 7(*a*) indicates a transparent substrate of which an insulation layer 42 (e.g., SiO$_2$ layer) is formed on a surface thereof. A silicon layer 61 adding a dopant and containing Si as a main component is provided on a predetermined region of the surface of the insulation layer 42.

A source region 62 and a drain region 64 are formed in the silicon layer 61. A channel region 63 is formed between the source region 62 and the drain region 64.

At the surface of the silicon layer 61, a gate oxide film 66 is formed over the source region 62, the channel region 63 and the drain region 64. A gate electrode 67 is positioned on the surface of the gate oxide film 66.

The surface of a side of the insulation layer 42 where the gate electrode 67 is positioned, is covered with a first inter layer insulation film 43. A part of the source region 62 and a part of the drain region 64 protrude from the gate oxide film 66. A first through-hole 69*a* and a second through-hole 69*b* are formed in the first inter layer insulation film 43; the source region 62 is exposed at a bottom surface of the first through-hole 69*a*; and the drain region 64 is exposed at the bottom surface of the second through-hole 69*b*.

The transparent substrate 41 in this state as an object to be film formed is carried in the film forming device 1 shown in FIG. 1. According to the step illustrated in FIG. 2(*b*), a first conductive film is formed on the surface of the side where the first inter layer insulation film 43 is formed; and then, a copper film is formed on the surface of the first conductive film according to the step illustrated in FIG. 2(*c*).

FIG. 7(*b*) shows the state in which the first conductive film 52 and the copper film 53 are formed. The first conductive film 52 is in close contact with the surface of the first inter layer insulation layer 43, and the inner wall surfaces and the bottom surfaces of the first and second through-holes 69*a*, 69*b*. Thus, the first conductive film 52 is in close contact with the surfaces of the source drain 62 and the drain region 64 at the bottom surfaces of the first and second through holes 69*a*, 69*b*, respectively. Further, in this state, the insides of the first and second through-holes 69*a*, 69*b* are filled with the first conductive film 52 and the copper film 53.

The transparent substrate 41 in that state is returned from the second film forming chamber 3 to the first film forming chamber 2. A second conductive film 54 is formed on the surface of the copper film 53 in the same manner as that when the first conductive film 52 was formed on the surface of the first inter layer insulation film 43 (FIG. 7(*c*)).

Reference numeral 50 in FIG. 7(*c*) indicates a conductor consisting of the first and second conductive films 52, 54 and the copper film 53.

Next, the conductor 50 is patterned so as to be divided into a portion that is filled with the first through-hole 69*a*, and a portion that is filled with the second through-hole 69*b*.

Reference numeral 51 in FIG. 7(*d*) indicates a source electrode consisting of a portion of the conductor 50 that is filled with the first through-hole 69*a* and a remaining portion surrounding the filled portion. Reference numeral 55 in FIG. 7(*d*) indicates a drain electrode consisting of a part of the conductor 50 that is filled with the second through-hole 69*b* and a remaining portion surrounding the filled portion.

As described above, the first conductive film 52 is in contact with the source region 62 and the drain region 64 on the bottom surfaces of the first and second through holes 69*a*, 69*b*, respectively. Thus, the first conductive film 52 of the source electrode 51 is electrically connected to the source region 62; and the first conductive film 52 of the drain electrode 55 is electrically connected to the drain region 64.

The copper film 53 and the second conductive film 54 are electrically connected to the first conductive film 52. Then, the copper film 53 and the second conductive film 54 of the source electrode 51 are electrically connected to the source region 62 through the first conductive film 52. The copper film 53 and the second conductive film 54 of the drain electrode 55 are electrically connected through the first conductive film 52 to the drain region 64. Accordingly, the entire source electrode 51 is electrically connected to the source region 62, and the entire drain electrode 55 is electrically connected to the drain region 64.

Figure 8A:
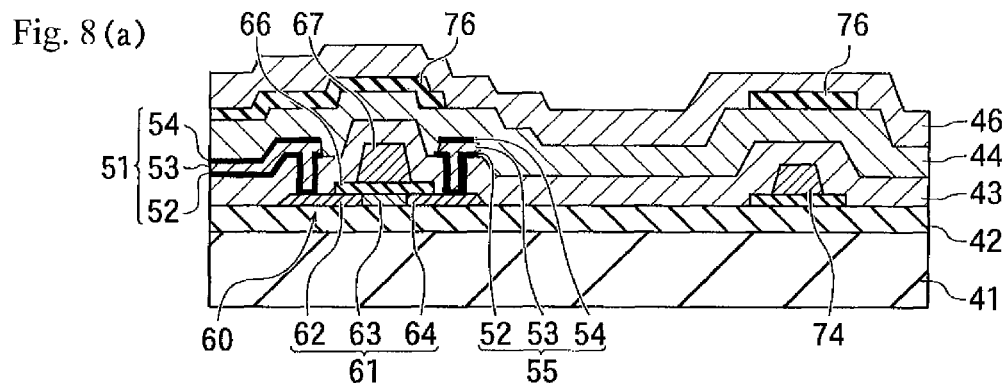
FIGS. 8(a) and 8(b) are cross-sectional views illustrating second half steps of the process for manufacturing the TFT panel.
Figure 8B:
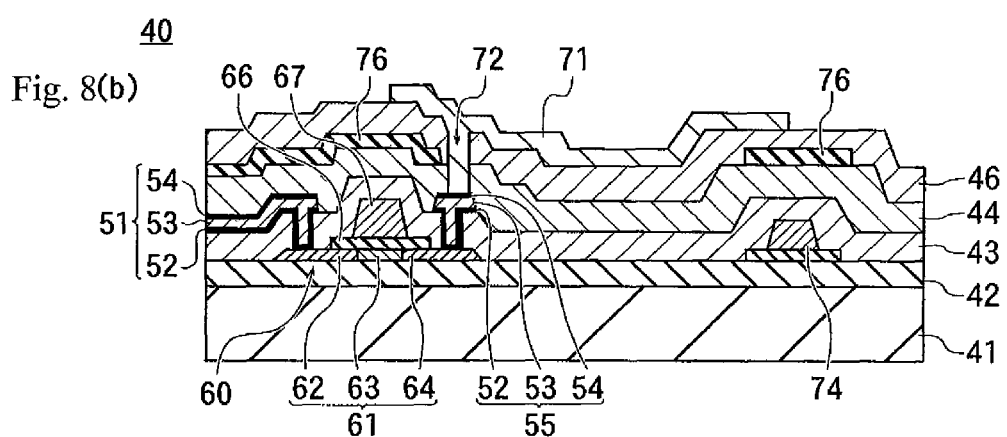

Next, a second inter layer insulation film 44 is formed on the surface of the transparent substrate 41 at the side on which the source electrode 51 and the drain electrode 55 are formed; a shield film 76 is provided at a predetermined position on the surface of the second inter layer insulation film 44; and thereafter, a third inter layer insulation film 46 is formed on the surface of the second inter layer insulation film 44 at the side on which the shield film 76 is provided (FIG. 8(*a*)).

Then, a third through-hole 72 that communicates with the second and third inter layer insulation films 44, 46 is formed just above the drain electrode 55. The second conductive film 54 of the drain electrode 55 is exposed on the bottom surface of the third through hole 72; thereafter, a transparent conductive film of ITO is formed on the surface at the side on which the third through hole 72 was formed, by a sputtering method; and then, the transparent conductive film is patterned so as to form a transparent electrode 71 made of ITO filled with the third through-hole 72 and transparent film remaining on and around the third through-hole 72(FIG. 8(*b*)).

Reference numeral 40 in FIG. 8(*b*) indicates a TFT panel (panel with Thin Film Transistor) in the state in which the transparent electrode 71 is formed.

As described above, the surface of the second conductive film 54 of the drain electrode 55 is positioned on the bottom surface of the third through hole 72. Thus, the transparent electrode 71 is electrically connected to the second conductive film 54 of the drain electrode 55.

Therefore, the copper film 53 and the first conductive film 52 of the drain electrode 55 are electrically connected through the second conductive film 54 to the transparent electrode 71 so that the entire drain electrode 55 is electrically connected to the transparent electrode 71, and the transparent electrode 71 and the drain region 64 are electrically connected thorough the drain electrode 55.

The channel region 63 has the same conductive type as that of the source and drain regions 62, 64. However, the impurity concentration of the channel region 63 is lower than that of the source and drain regions 62,64.

When a voltage is applied to the gate electrode 67 in the state in which voltage is applied to the source region 62 and the drain region 64, a low resistive storage layer is formed at a portion of the channel region 63 which is in contact with the gate electrode 67 through the gate oxide film 66; and the source region 62 and the drain region 64 are electrically connected through the storage layer. Thus, a current flows.

The channel region 63 can be a conductive type opposed to the conductive type of the source and the drain regions 62, 64. In such a case, when a voltage is applied to the gate electrode 67, an inversion layer of the same conductive type as that of the source and drain regions 62, 64 is formed at the portion which is in contact with the gate electrode 67, through the gate oxide film 66, of the channel region 63; and the source region 62 and the drain region 64 are electrically connected by the inversion layer. Thus, a current flows.

When a current flows between the source region 62 and the drain region 64, a current flows through the transparent electrode 71 since the drain electrode 55 is electrically connected to the transparent electrode 71.

The first and second conductive films 52, 54 formed by the present invention have high adhesion to Si so that the source electrode 51 and the drain electrode 55 are hardly peeled off from the silicon layer 61; also, the first and second conductive films 52, 54 have high diffusion preventive properties; and thus, the component metal (Cu) of the copper film 53 does not diffuse in the silicon layer 61.

In addition, the conductive films 52 and 54 formed in the present invention have low specific resistances; also, they have low contact resistances to the transparent conductive film. Consequently, the source electrode 51 and the drain electrode 55 of this TFT 60 have excellent electrical conductivities.

Thus, the conductive films formed according to the present invention are suited for a barrier film of an electrode which adheres to the silicon layer 61 and the transparent electrode 71.

Other wiring, such as a gate wiring film and a source wiring film, and other electrical components are arranged at positions spaced apart from TFT 60 on the surface of the transparent substrate 41 of the TFT panel 40. Here, the gate wiring film 74 is illustrated.

According to the formation methods of the present invention, the cases in which the conductive films are formed on the surfaces and the back surfaces of the source electrode 51 and the drain electrode 55, respectively, will be explained.

The present invention is not, however, limited to these cases.

Figure 9:
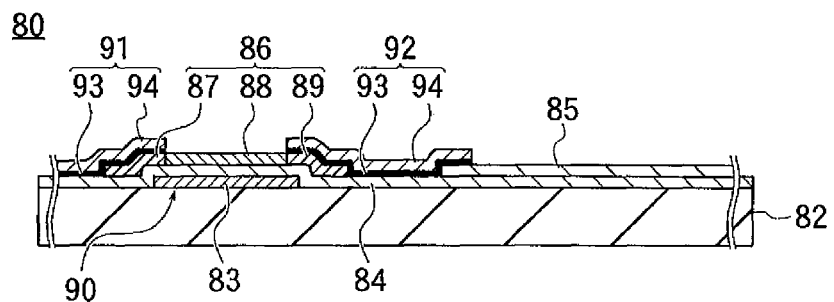
FIG. 9 is a cross sectional view illustrating one example of the TFT panels that are manufactured according to the present invention.

Reference numeral 80 in FIG. 9 indicates the second example of the TFT panels that are manufactured according to the present invention. This TFT panel 80 has a transparent substrate 82 and a TFT 90 that is positioned on the surface of the transparent substrate 82.

The gate electrode 83 of this TFT 90 is positioned on the surface of the transparent substrate 82. An insulation film 84, which covers the surface and the side surface of the gate electrode 83, is formed on the surface of the transparent substrate 82 at a side on which the gate electrode 83 is positioned. A silicon layer 86 is provided at a position on the gate electrode 83 on the surface of the insulation film 84, and a transparent electrode 85 consisting of a transparent conductive film is arranged on the surface of the insulation layer 84 at a position spaced apart from the silicon layer 86.

A source region 87, a channel region 88 and a drain region 89 are formed in the silicon layer 86 similar to the silicon layer 61 illustrated in FIG. 8(*b*). The bottom surface of the source electrode 91 is in close contact with the surface of the source region 87, and the bottom surface of the drain electrode 92 is in close contact with the surface of the drain region 89. A part of the drain electrode 92 is extended to the transparent electrode 85, and the bottom surface of the drain electrode 92 is in close contact with the surface of the transparent electrode 85. Accordingly, the bottom surface of the drain electrode 92 is in close contact with both the drain region 89 and the transparent electrode 85.

The source electrode 91 and the drain electrode 92 have a conductive film 93 and a copper film 93 that were formed by the formation method according to the present invention. For example, the source electrode 91 and the drain electrode 92 are formed such that a substrate of which the transparent electrode 85 and the silicon layer 86 are exposed on the transparent substrate 82 is used as an object to be film formed, a conductive film is formed on the entire surface of the object, a copper film is formed on the surface of the conductive film, and the conductive film and the copper film are patterned at the same time. After a copper film is formed on the surface of the conductive film, the conductive film and the copper film are patterned at the same time. Thus, the source electrode 91 and the drain electrode 92 are obtained.

Each conductive film 93 is positioned on the bottom surfaces of the drain electrode 92 and the source electrode 91. As described above, the bottom surface of the drain electrode 92 is closely in contact with both the drain region 89 and the transparent electrode 85 so that the conductive film 93 of the drain electrode 92 is electrically connected to both the transparent electrode 85 and the drain region 89.

The copper film 94 is closely in contact with the conductive film 93, the copper film 94 of the drain electrode 92 is electrically connected through the conductive film 93 to both the transparent electrode 85 and the drain region 89. The entire drain electrode 92 is electrically connected to both the drain electrode 89 and the transparent electrode 85.

Further, because the bottom surface of the source electrode 91 is closely in contact with the source region 87, the conductive film 93 of the source electrode 91 is electrically connected to the source region 87, and the copper film 94 of the source electrode 91 is electrically connected to the source region 87 through the conductive film 93 and thus, the entire source electrode 91 is electrically connected to the source region 87.

As described above, the conductive film 93 formed by the present invention has low contact resistance to ITO; and thus, the electrical conductivity between the drain electrode 92 and the transparent electrode 85 is excellent.

Also in this TFT panel 80, the source electrode 91 is connected to source wiring (not shown), voltage is applied to the gate electrode 83 and voltage is applied from the source wiring to the source electrode 91, and when a voltage difference between the gate electrode 83 and the source electrode 91 is generated, a current flows from the source region 87 through the channel region 88 to the drain region 89; and the current is supplied through the drain electrode 92 to the transparent electrode 85.

Figure 10:
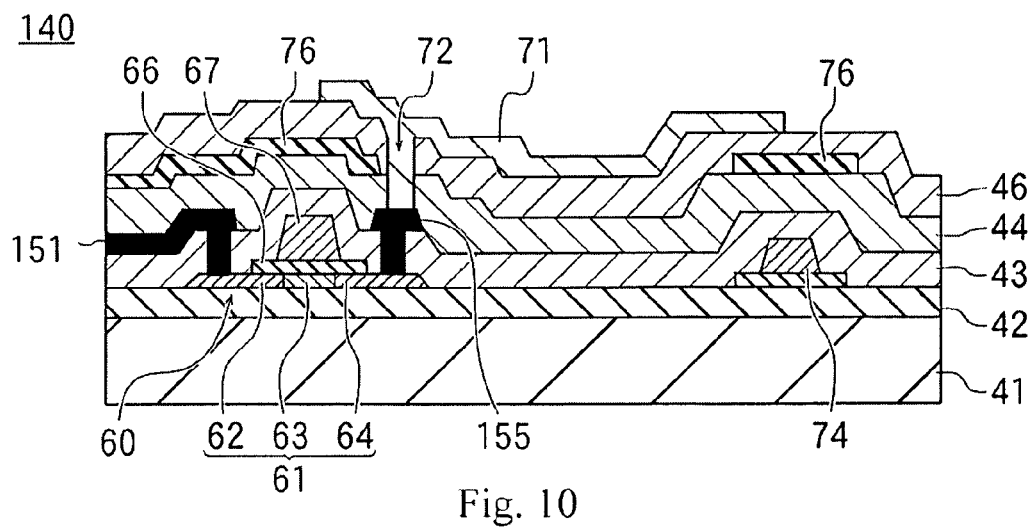
FIG. 10 is a cross sectional view illustrating another example of the TFT panels that are manufactured according to the present invention.

As mentioned above, the case, in which the source electrode and the drain electrode are constituted by a conductive film and a copper film, is explained. The present invention is however not limited thereto. Reference numeral 140 in FIG. 10 indicates the third example of TFT panel of the present invention, and this TFT panel 140 has the same structure as that of the TFT panel 40 shown in FIG. 8(*b*) above, except that the source electrode 151 and the drain electrode 155 are constituted by the conductive film formed according to the present invention.

The TFT panel of the present invention is used for, for example, liquid crystal displays and organic EL display devices.

While ITO is used as a construction material of the transparent electrodes 71 and 85 as described above, the present invention is not limited to this case; and in addition to ITO, a zinc oxide film and a transparent conductive film consisting of various metal oxides can be used.

Specifically, a target section 10 that is used for formation of conductive films is not limited. For example, reference numeral 18 in FIG. 18 indicates another example of the film forming device that is used for the present invention, and this film forming device 18 has the same structure as that of the film forming device 1 in FIG. 1 above, except that the target section is constituted by a single plate-like target 19 in the film forming device 18.

The target 19 is an alloy target including copper as a main component and at least one additive metal as described above. When the conductive film 25 is formed using this target 19 as a substitute for the target section 10 shown in FIG. 1, the content of additive metals in the conductive film 25 becomes nearly equal to the content of the additive metals in the target 19.

Further, each test is performed using this target 19 for adhesion, specific resistance, diffusion test, electrode evaluation, contact resistance to ITO, and types of additive metals with respect to each content of Zr and Ti. Then, test results similar to those when the target section 10 is used in FIG. 1 are obtained.

As mentioned above, the cases in which the copper film 53 containing copper as a main component and the conductive films (the first and the second conductive films 52, 54) are formed using the other targets is explained. The present invention is not, however, limited to these cases.

For example, the conductive film is formed by sputtering the target section 10 while introducing an oxygen gas and a sputter gas inside the first film forming chamber 2; and thereafter, the oxygen gas partial pressure is decreased to a pressure less than that when the conductive film is formed by vacuum evacuating inside the first film forming chamber 2. Consequently, the copper film may be formed by sputtering the target section 10 that is used for the formation of the conductive film.

In this case, when the conductive film is formed, the oxygen gas partial pressure that improves the adhesion may be selected; and when the copper film is formed, the oxygen partial pressure that decreases the specific resistance may be selected.

The first and second conductive film 52 and 54 may be formed by using the same target 10, or may be formed by using different target 10 so as to change contents and/or types of additive metals. Furthermore, when the first and second conductive film 52 and 54 are formed, oxygen partial pressure may be the same pressure or it may be varied.

Methods for anneal treatment are not limited in particular. However, it is preferable that the treatment is performed in the vacuum ambience; and also, during transporting an object to be film formed in the state that the conductive film has formed, to other film forming chamber or a heating device, the object may be transported in the vacuum ambience in order to prevent exposing the object to air atmosphere.

The sputter gas is not limited to Ar, and, in addition to Ar, Ne and Xe can be used. The conductive films formed according to the present invention can be used for electrodes and barrier films of TFT panels, and also for barrier films, electrodes (wiring films) and other electronic components (such as, semiconductor elements and a wiring board).

In addition, oxidation gas is not particularly limited. Any gas that contains oxygen atoms in chemical structure thereof can be used and; thus, $O_3$ and $H_2O$ or the like can be used in addition to oxygen ($O_2$). The transparent substrate is not limited to a glass substrate. For example, a quartz substrate and plastic substrate can be used.

The type and manufacturing method of silicon layer used for the present invention are not limited in particular. For example, various silicon layers for using TFT (such as, silicon layers, amorphous silicon layer, polysilicon layer or the like deposited by sputter method or evaporation method) can be used for the present invention.

Additive metals, such as, described above, Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd, are preferably used in the present invention. Among these metals, a conductive film containing one type of additive metal may be formed by using only one type; alternatively, by using two types or more, a conductive film containing two or more types of additive metals may be formed. In the additive metals described above, Group 4 elements, such as, Ti and Zr, are suited for the present invention in particular.

Next, the steps for manufacturing the fourth example of the present invention will be explained.

Figure 13:
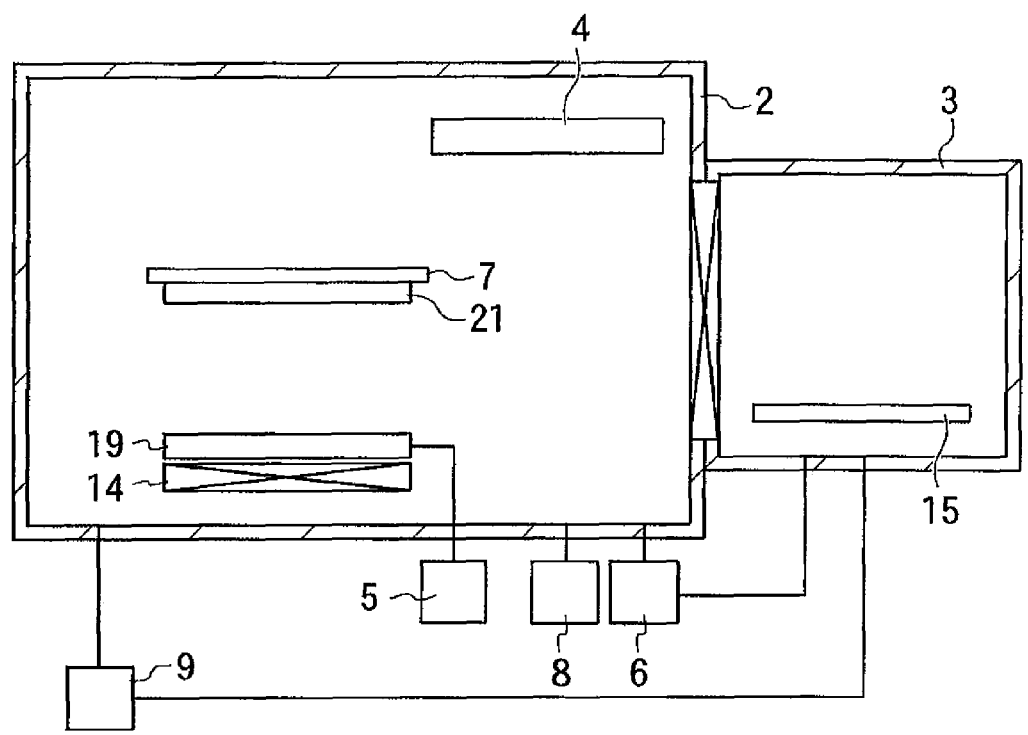
FIG. 13 is a cross sectional view illustrating another example of the film forming devices used for the present invention.

A substrate (e.g., glass substrate) as an object to be film formed is carried in the inside of the vacuum chamber 2 of the film forming device 1 or 18 in FIG. 1 or FIG. 13.

The first conductive film, the copper film, and the second conductive film are layered on the surface of the substrate in the described order by the same steps as that described in FIGS. 7(a) to 7(c), above.

Figure 14A:
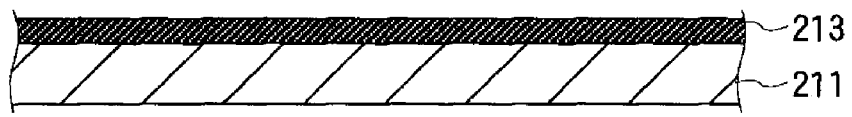

FIG. 14(a) shows the state that the conductor 213 is formed on the surface of the substrate 211.

Figure 14B:
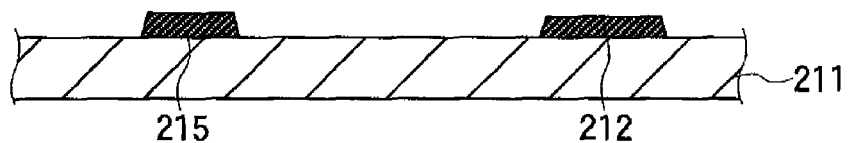
Figure 14C:
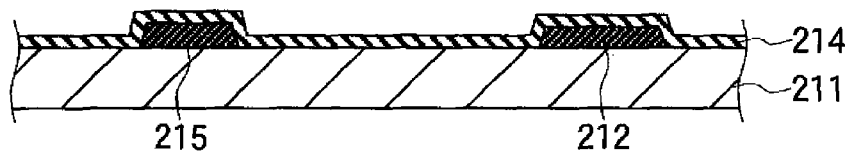

Next, when the conductor 213 is patterned by a photographing step and an etching step, the gate electrode 215 and the storage capacitor electrode 212 are formed by the conductor 213 patterned, as shown in FIG. 14(b).

The gate insulation film 214 consisting of silicon nitride film (SiN), silicon oxide film ($SiO_2$), or silicon nitride oxide film (SiON) is formed on the surface of the substrate 211 where the gate electrode 215 and the storage capacitor electrode 212 are formed by the CVD method or the like.

Figure 16:
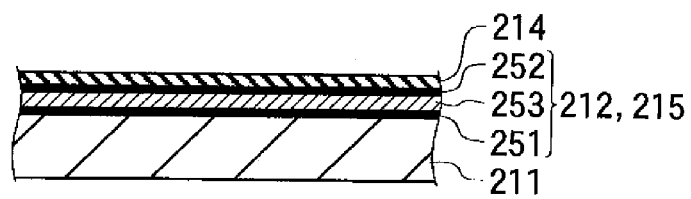
FIG. 16 is an enlarged sectional view illustrating a gate electrode and a storage capacitor electrode.

FIG. 16 is an enlarged sectional view illustrating a portion where a gate electrode 215 (or storage capacitor electrode 212) is positioned.

The gate electrode 215 and the storage capacitor electrode 212 have the first and second conductive films 251, 252 and the copper film 253 as described above. The first conductive film 251 is in close contact with the substrate 211; the second conductive film 252 is in close contact with the gate insulation film 214; and the copper film 253 is positioned between the first and second conductive films 251 and 252.

The first and second conductive films 251, 252 contain oxygen and additive metals; and thus, they have strong adhesion to the substrate 211 and the gate insulation film. Further, the copper film 253 having low electric resistance is arranged between the first conductive film 251 and the second conductive film 252; and thus, the electric resistance of the entire gate electrode 215 and the storage capacitor electrode 212 is low.

Figure 14D:
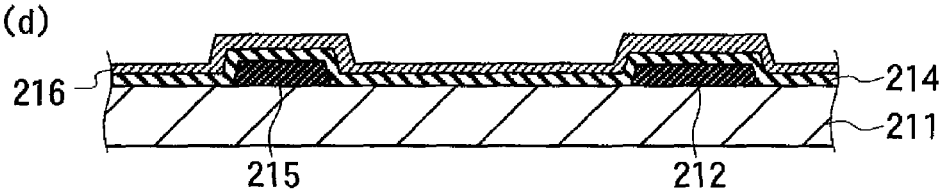
Figure 4E:
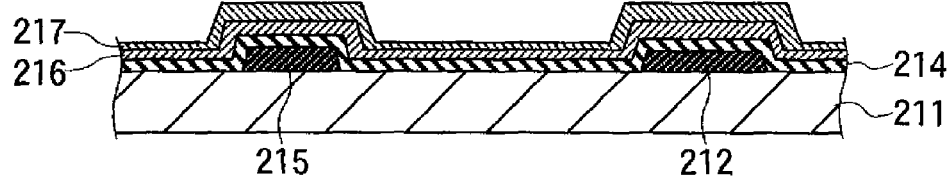

After formation of the gate insulation film 214, the channel semiconductor layer (channel region) 216 made of, for example, amorphous silicon, is formed on the surface of the gate insulation film 214 by CVD method or the like (FIG. 14(d)).

An ohmic layer 217 that contains silicon as a main component, and contains impurities, is formed on the surface of the channel semiconductor layer 216 by the CVD method or the like (FIG. 14(e)).

Figure 15A:
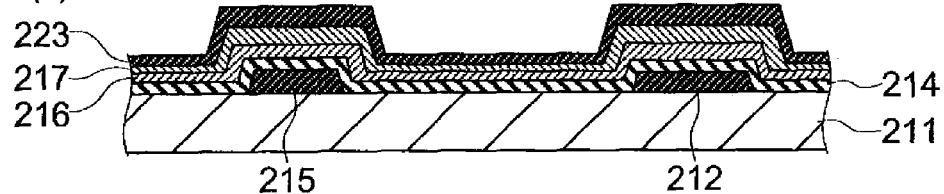
FIGS. 15(a) to 15(d) are cross sectional views illustrating second half steps of the process for manufacturing the fourth example of TFT.

The substrate 211 of which the ohmic layer 217 is formed is carried to the inside of the vacuum chamber 2 of the film forming device 1 or 18 in FIG. 1 or FIG. 13; and the first conductive film 251, the copper film 253, and the second conductive film 252 are layered in the described order by steps similar to the steps used in the film formation of the conductor 213 above; thereby, forming the conductor 223 (FIG. 15(a)).

The conductor 223, the ohmic layer 217, and the channel semiconductor layer 216 are patterned by the photographing step and the etching step.

A portion of the channel semiconductor layer 216 which is positioned right above the gate electrode 215 and portions of the channel semiconductor layer 216 positioned at both sides of the gate electrode 215 are left to remain by patterning.

Further, among the ohmic layer and the conductor 223, which are positioned on the channel semiconductor layer 216, parts of the ohmic layer 217 and the conductor 223, which are positioned right above the gate electrode 215, are removed; and the portions, which are positioned on both sides of the gate electrode 215 are left to remain by this patterning.

Figure 15B:
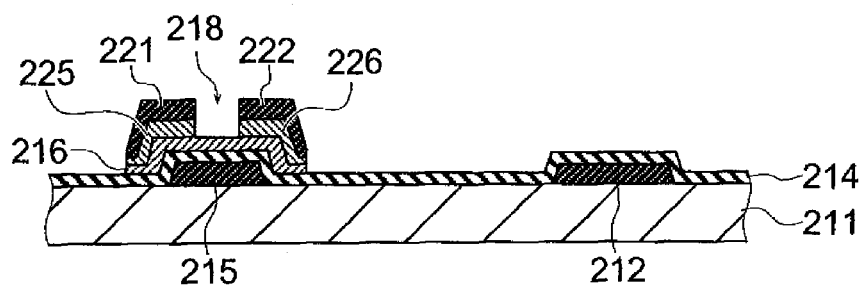

Reference numerals 225 and 226 in FIG. 15(b) respectively indicate a source semiconductor layer (source region) and a drain semiconductor layer (drain region) that are formed with portions of the ohmic layer 217 remaining on both sides of the gate electrode 215.

Reference numerals 221 and 222 in FIG. 15(b) indicate a source electrode and a drain electrode that are formed with portions of the conductor 223 that remain on both sides of the gate electrode 215.

Figure 15C:
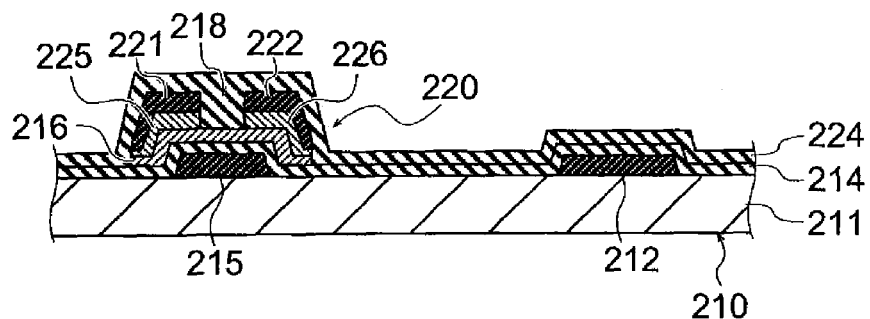

The inter layer insulation film 224 made of a silicon nitride film, a silicon oxide film, or a silicon nitride oxide film is formed on the surface of the source electrode 221 and the surface of the drain electrode 222 by the CVD method or the like (FIG. 15(c)).

Reference numeral 220 in FIG. 15(c) indicates a thin film transistor (TFT) in the state that the inter layer insulation film 224 is formed, and reference numeral 210 in FIG. 15(c) indicates a panel with a thin film transistor.

The source electrode 221 and the drain electrode 222 have the first and second conductive films 251 and 252, and copper films 253, as in the gate electrode 215 and the storage capacitor electrode 212; the first conductive film 251 is in close contact with the ohmic layer 217, the second conductive film 252 is in close contact with the inter layer insulation film 224; and the copper film 253 is positioned between the first and second conductive films 251 and 252.

The ohmic layer 217 includes silicon as a main component. The first and second conductive films 251 and 252 include oxygen and additive metals; and thus, they have strong adhesion to silicon and insulation film. Accordingly, the source electrode 221 and the drain electrode 222 are hardly peeled off from the ohmic layer 217 and the inter layer insulation film 224. Further, copper does not diffuse from the first and second conductive films 251 and 252 to the ohmic layer 217.

In this thin film transistor 220, between the source semiconductor layer 225 and the drain semiconductor layer 226, and between the source electrode 221 and the drain electrode 222, there is the opening 218 right above the center of the gate electrode 215 so as to separate them from each other. The opening 218 is filled with the inter layer insulation film 224.

The channel semiconductor layer 216 is the same conductive type as that of the source and drain semiconductor layers 225 and 226. However, the impurity concentration of the channel semiconductor layer 216 is lower than the impurity concentrations of the source and drain semiconductor layers 225 and 226.

In the state in which voltages are applied to the source semiconductor layer 225 and the drain semiconductor layer 226, when a voltage is applied to the gate electrode 215, a low resistive storage layer is formed at a portion where the channel semiconductor layer 216 is in contact with the gate electrode 215 through the gate insulation film 214; and the source semiconductor layer 225 and the drain semiconductor layer 226 are electrically connected through this storage layer. Thus, a current flows.

The channel semiconductor layer 216 may be the conductive type opposed to the source and drain semiconductor layers 225 and 226.

In the state in which voltages are applied to the source semiconductor layer 225 and the drain semiconductor layer 226, when a voltage is applied to the gate electrode 215, an inversion layer of the same conductive type as that of the source and drain semiconductor layers 225 and 226 is formed at a portion of the channel semiconductor layer 216 where it is in contact with the gate electrode 215 through the gate insulation film 214 of the channel semiconductor layer 216; consequently, the source semiconductor layer 225 and the drain semiconductor layer 226 are electrically connected through the inversion layer. Thus, a current flows.

Figure 15D:
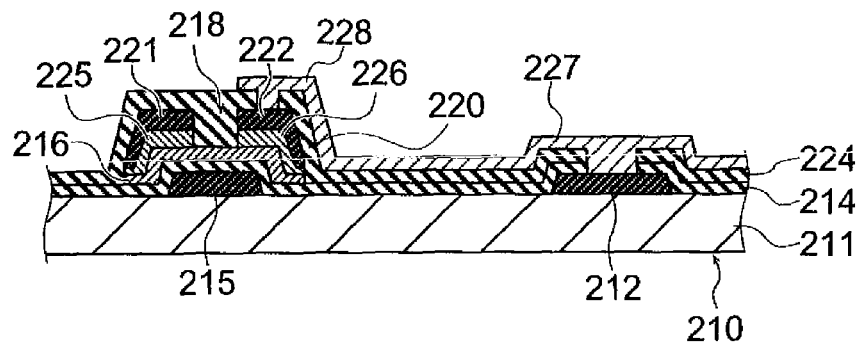

FIG. 15(d) shows the state in which the patterned transparent conductive film 228 is provided on the inter layer insulation film 224 after openings are formed at a portion of the inter layer insulation film 224 above the drain electrode 222 or the source electrode 221 (in this case, above the drain electrode 222) and a portion of the inter layer insulation film 224 above the storage capacitor electrode 212.

Reference numeral 227 in FIG. 15(d) indicates a pixel electrode made of a portion of the transparent conductive film positioned at the side of the thin film transistor 220.

Reference numeral 228 in FIG. 15(d) shows a connection member made of a portion of the of the transparent conductive film positioned on the thin film transistor 220 and being in contact with the drain electrode 222.

The pixel electrode 227 is eclectically connected through the connection 228 to the drain electrode 222. Thus, when the source semiconductor layer 225 is electrically connected to the drain semiconductor layer 226, a current flows in the pixel electrode 227.

Figure 17:
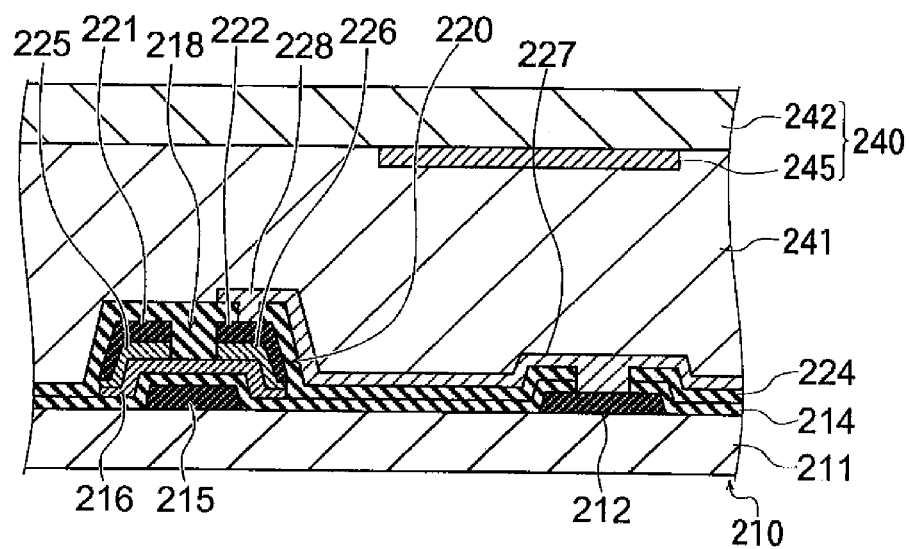
FIG. 17 is a sectional view illustrating one example of a liquid crystal display device.

Reference numeral 204 in FIG. 17 indicates a liquid crystal display device of which liquid crystal 241 is arranged between the panel 240 and the substrate 211 of which TFT 220 is formed.

The panel 240 has a glass substrate 242 and an opposite electrode 245 arranged on the surface of the glass substrate 242. The opposite electrode 245 and the pixel electrode 227 are opposed while interposing the liquid crystal 241 between them.

Light transmittance of the liquid crystal 241 can be varied by controlling a voltage applied between the pixel electrode 227 and the opposite electrode 245.

The liquid crystal display device 204 may be prepared by using the substrate 211 in which any of the first to the third examples of TFTs is formed, in place of the fourth example of TFT 220.

What is claimed is:

1. A method for forming a conductive film of which forming a conductive film including copper as a main component and additive metal on a surface of an object to be film formed in vacuum ambience by a sputtering method, the method comprising the step of
sputtering a target containing copper as a main component and at least any one type of additive metal selected from the group consisting of Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd, while supplying an oxidation gas that has oxygen atoms in its chemical structure, for reaction with the additive metal, into the vacuum ambience, such that a ratio of a partial pressure of the oxidation gas to a total pressure of the vacuum ambience is at least 0.1% and at most 20%, thereby making the conductive film include the additive metal therein.

2. The method for forming a conductive film according to claim 1, wherein
the conductive film is formed on at least one of a surface of a silicon layer and a surface of a glass substrate by using the object to be film formed where at least one of the silicon layer and the glass substrate is exposed at least a part of a surface of the object.

3. The method for forming a conductive film according to claim 1, wherein Ti is selected as the additive metal and oxygen gas is used as the oxidation gas, and
the oxygen gas is introduced such that the conductive film contains at least 0.1 atom % Ti.

4. The method for forming a conductive film according to claim 1, wherein Zr is selected as the additive metal and oxygen gas is used as the oxidation gas, and
the oxygen gas is introduced such that the conductive film includes at least 0.1 atom % Zr.

5. The method for forming a conductive film according to claim 1, wherein
the object to be film formed, of which a transparent conductive film is exposed to at least a part of a surface thereof is used, and
wherein the conductive film is formed on a surface of the transparent conductive film.

6. A method for manufacturing a thin-film transistor having a conductive film being in contact with a silicon layer, the method comprising the step of:
sputtering a target in a vacuum ambience so as to form the conductive film, the target containing copper as a main component and containing at least any one type of additive metal selected from the group consisting of Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd, while supplying an oxidation gas that has oxygen atoms in its chemical structure, for reaction with the additive metal, such that a ratio of partial pressure of the oxidation gas to a total pressure of the vacuum ambience is at least 0.1% and at most 20%, into the vacuum ambience.

7. A method for manufacturing a thin-film transistor having a conductive film being in contact with a transparent conductive film, the method comprising the step of:
sputtering a target in a vacuum ambience so as to form the conductive film, the target containing copper as a main component and containing at least any one type of additive metal selected from the group consisting of Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd, while supplying an oxidation gas that has oxygen atoms in its chemical structure, for reaction with the additive metal, such that a ratio of partial pressure of the oxidation gas to a total pressure of the vacuum ambience is at least 0.1% and at most 20%, into the vacuum ambience.

8. A method for manufacturing a thin-film transistor having a conductive film being in contact with a glass substrate, the method comprising the step of:
sputtering a target in a vacuum ambience to form the conductive film, while supplying an oxidation gas that has oxygen atoms in its chemical structure, for reaction with the additive metal, such that a ratio of partial pressure of the oxidation gas to a total pressure of the vacuum ambience is at least 0.1% and at most 20%, into the vacuum ambience, and
wherein the target contains copper as a main component and contains at least any one type of additive metal selected from the group consisting of Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd.

9. A method for manufacturing a thin-film transistor having a conductive film being in contact with a silicon layer and a transparent conductive film, the method comprising the step of:
sputtering a target in a vacuum ambience to form the conductive film, while supplying an oxidation gas that has oxygen atoms in its chemical structure, for reaction with the additive metal, such that a ratio of partial pressure of the oxidation gas to a total pressure of the vacuum ambience is at least 0.1% and at most 20%, into the vacuum ambience, and
wherein the target contains copper as a main component and contains at least any one type of additive metal selected from the group consisting of Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd.

10. A method for manufacturing a thin-film transistor having a silicon layer containing silicon as a main component, a first conductive film being in contact with the silicon layer, a copper film containing copper as a main component and formed on a surface of the first conductive film, and a second conductive film formed on a surface of the copper film, the second conductive film being in contact with a transparent conductive film, the method comprising the step of:
sputtering a target in a vacuum ambience so as to form the first and second conductive films, while supplying an oxidation gas that has oxygen atoms in its chemical structure, for reaction with the additive metal, such that a ratio of partial pressure of the oxidation gas to a total pressure of the vacuum ambience is at least 0.1% and at most 20%, into the vacuum ambience, and
wherein the target contains copper as a main component and contains at least any one type of additive metal selected from the group consisting of Ti, Zr, Hf, V, Nb, Ta, Cr, Mo, W, Mn, Fe, Ru, Os, Co, Ni, Bi, Ag, Zn, Sn, B, C, Al, Si, La, Ce, Pr, and Nd.

* * * * *